US011422109B2

(12) United States Patent
Sirringhaus et al.

(10) Patent No.: US 11,422,109 B2
(45) Date of Patent: Aug. 23, 2022

(54) AQUEOUS MEDIA SENSOR

(71) Applicant: CAMBRIDGE ENTERPRISE LIMITED, Cambridge (GB)

(72) Inventors: Henning Sirringhaus, Cambridge (GB); Jerome Charmet, Cambridge (GB); Mark Nikolka, Cambridge (GB); Dimitrios Simatos, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 399 days.

(21) Appl. No.: 16/471,331

(22) PCT Filed: Dec. 20, 2017

(86) PCT No.: PCT/EP2017/083797
§ 371 (c)(1),
(2) Date: Jun. 19, 2019

(87) PCT Pub. No.: WO2018/115112
PCT Pub. Date: Jun. 28, 2018

(65) Prior Publication Data
US 2020/0116667 A1    Apr. 16, 2020

(30) Foreign Application Priority Data
Dec. 21, 2016 (GB) .................................. 1621828

(51) Int. Cl.
*G01N 27/414*    (2006.01)

(52) U.S. Cl.
CPC .................................. *G01N 27/414* (2013.01)

(58) Field of Classification Search
None
See application file for complete search history.

(56) References Cited

U.S. PATENT DOCUMENTS

2013/0161599 A1   6/2013  Katz et al.

OTHER PUBLICATIONS

M. Yun, et al., "Stable Organic Field-Effect Transistors for Continuous and Nondestructive Sensing of Chemical and Biologically Relevant Molecules in Aqueous Environment", ACS Applied Materials and Interfaces, 6(3): p. 1616-1622, Feb. (Year: 2014).*
W. Zhang, et al., "Indacenodithiophene Semiconducting Polymers for High-Performance, Air-Stable Transistors", Journal of the American Chemical Society, 132(33): p. 11437-11439, Aug. (Year: 2010).*
Oren Knopfmacher, et al., "Highly stable organic polymer field-effect transistor sensor for selective detection in the marine environment", Nature Communications, Jan. 6, 2014, pp. 1-9, vol. 5.

(Continued)

*Primary Examiner* — J. Christopher Ball
(74) *Attorney, Agent, or Firm* — Sughrue Mion, PLLC

(57) ABSTRACT

A sensor device for detecting a target species in an aqueous media and/or measuring the concentration of a target species in an aqueous media, the sensor device comprising: (a) an active semiconductor comprising an organic semiconductor material that exhibit substantially the same transfer curve for a period of at least 24 hours when first exposed to air; and (b) a structure for directing an aqueous media into contact with the sensor device.

15 Claims, 22 Drawing Sheets

(56) References Cited

OTHER PUBLICATIONS

Francesca Leonardi, et al., "Electrolyte-Gated Organic Field-Effect Transistor Based on a Solution Sheared Organic Semiconductor Blend", Advanced Materials, Feb. 10, 2016, pp. 10311-10316, vol. 28, No. 46.
Guanghao Lu, et al., "Moderate doping leads to high performance of semiconductor/insulator polymer blend transistors", Nature Communications, Mar. 12, 2013, pp. 1-8, vol. 4.
Mark Nikolka, et al., "High operational and environmental stability of high-mobility conjugated polymer field-effect transistors through the use of molecular additives", Nature Materials, Dec. 12, 2016, pp. 356-362, vol. 16, No. 3.
International Search Report for PCT/EP2017/083797 dated Feb. 21, 2018 (PCT/ISA/210).
Written Opinion for PCT/EP2017/083797 dated Feb. 21, 2018 (PCT/ISA/237).

* cited by examiner

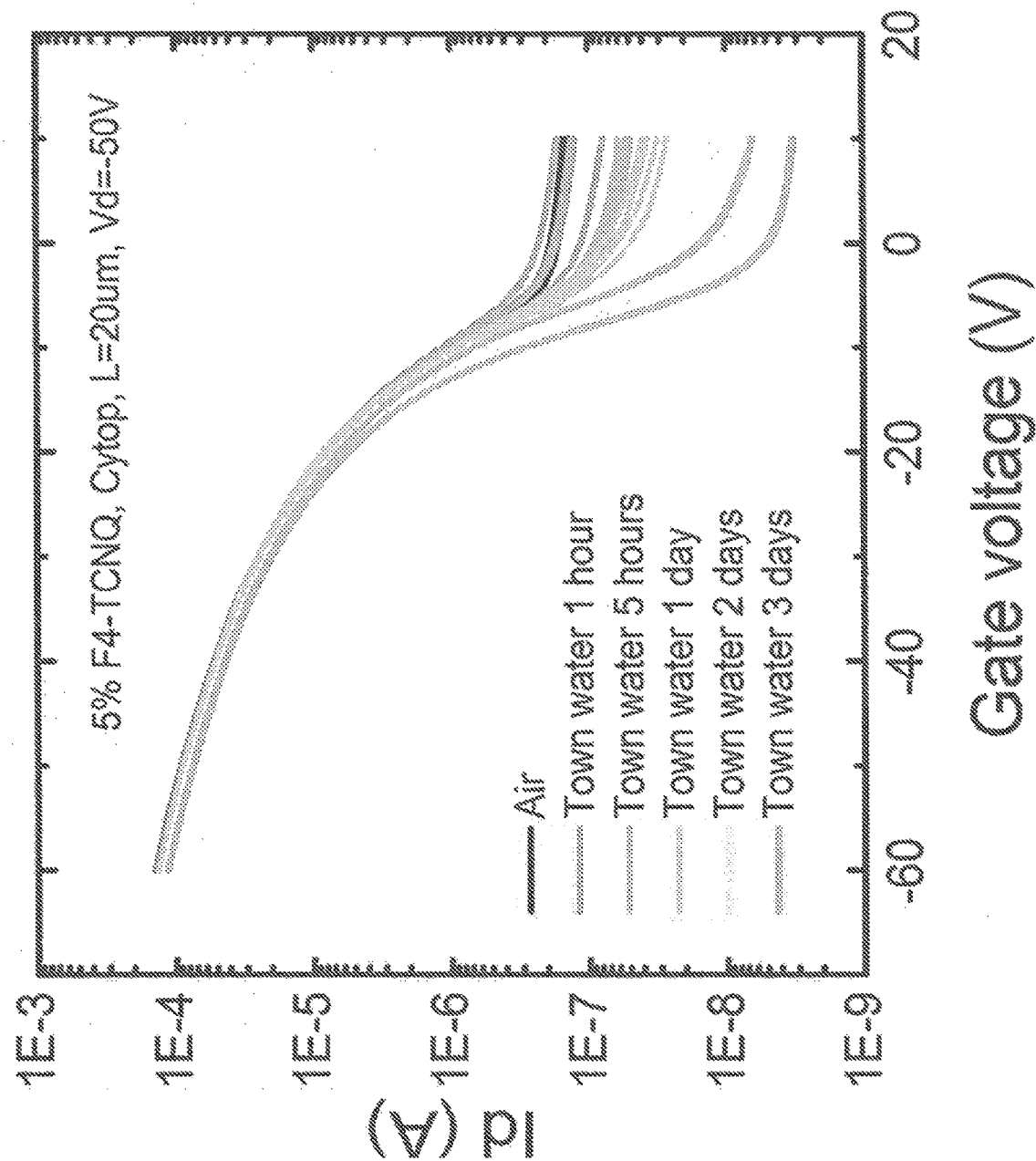
Figure 3a-i

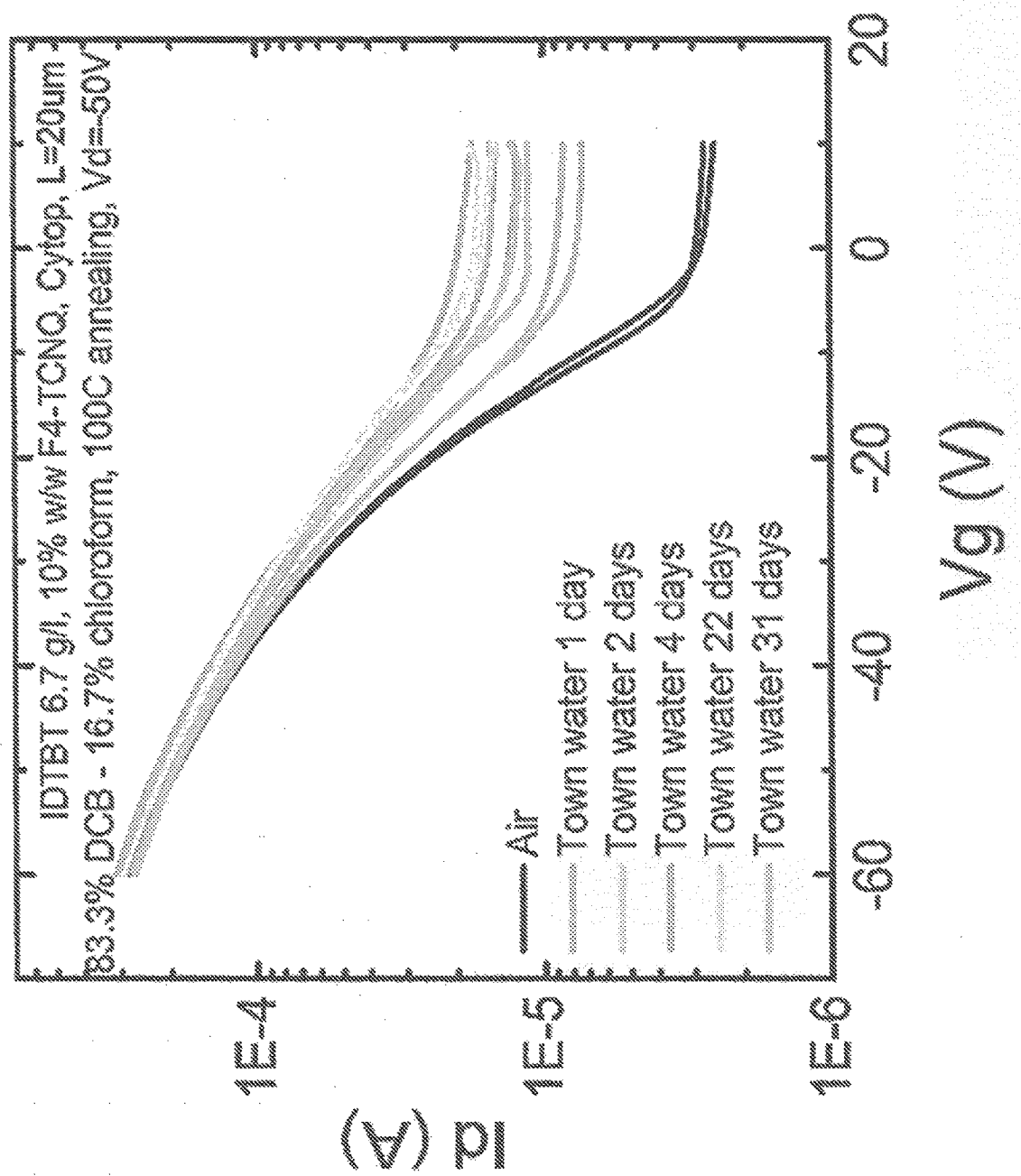
Figure 3a-ii

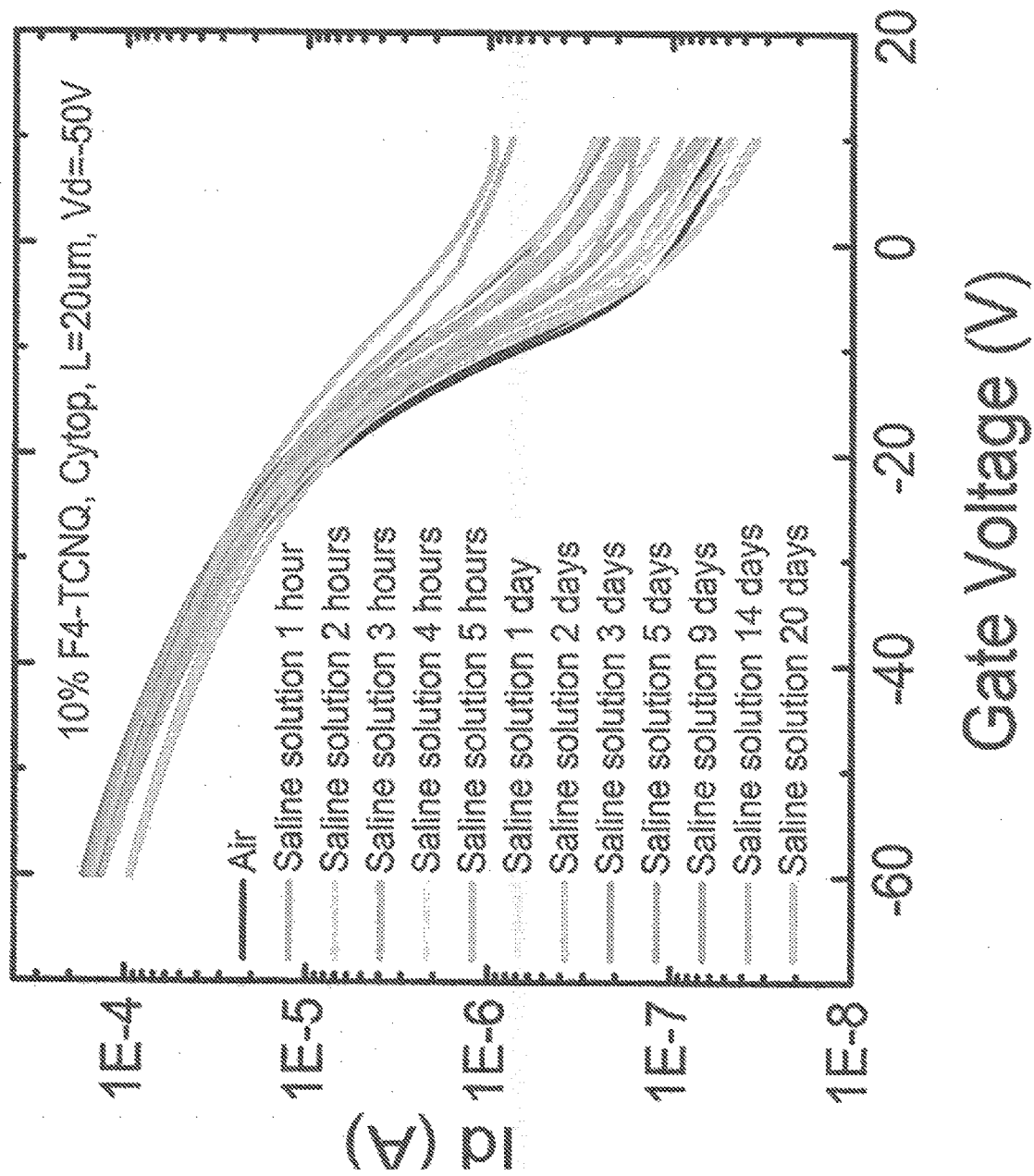
Figure 4a-i

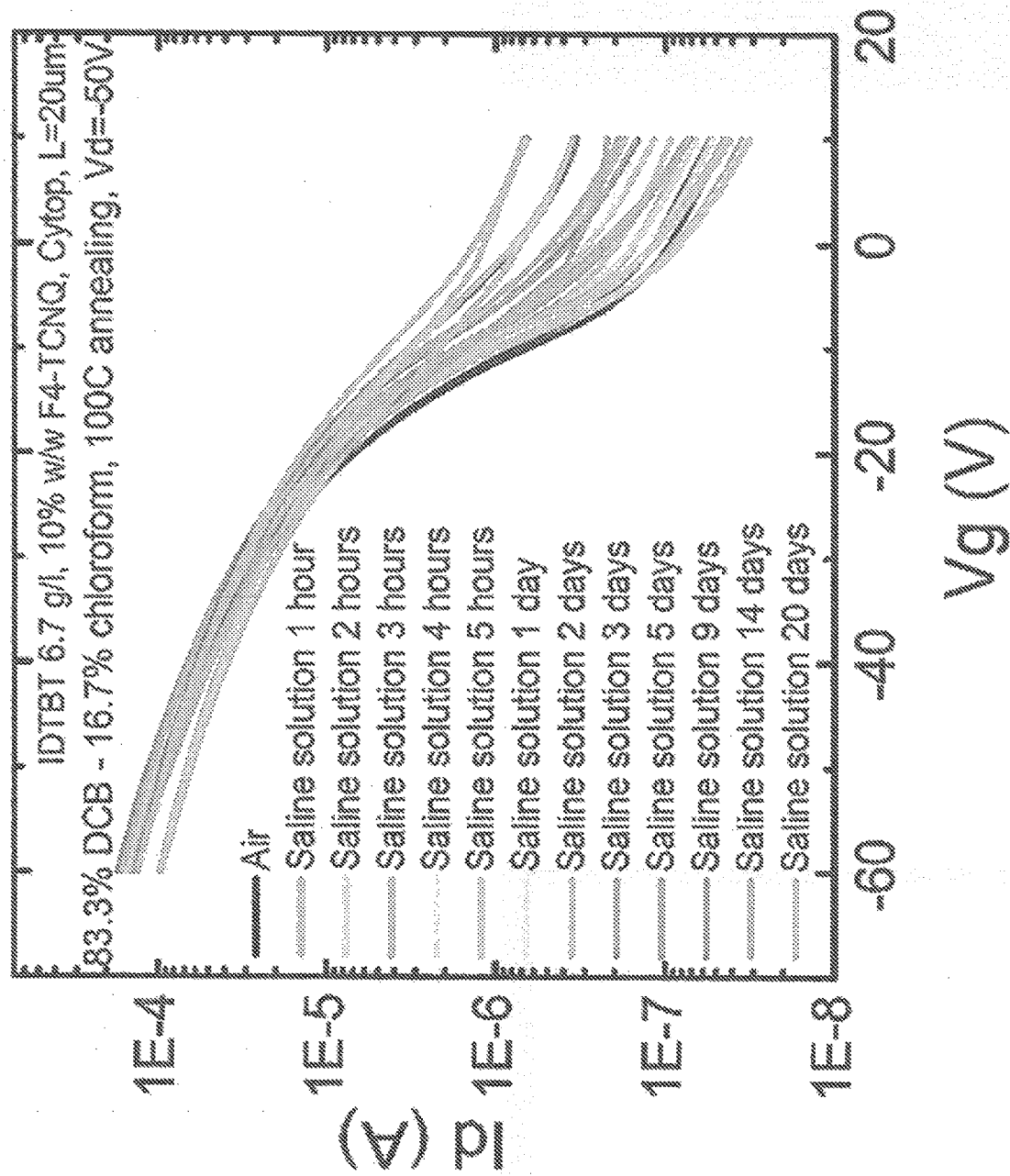
Figure 4a-ii

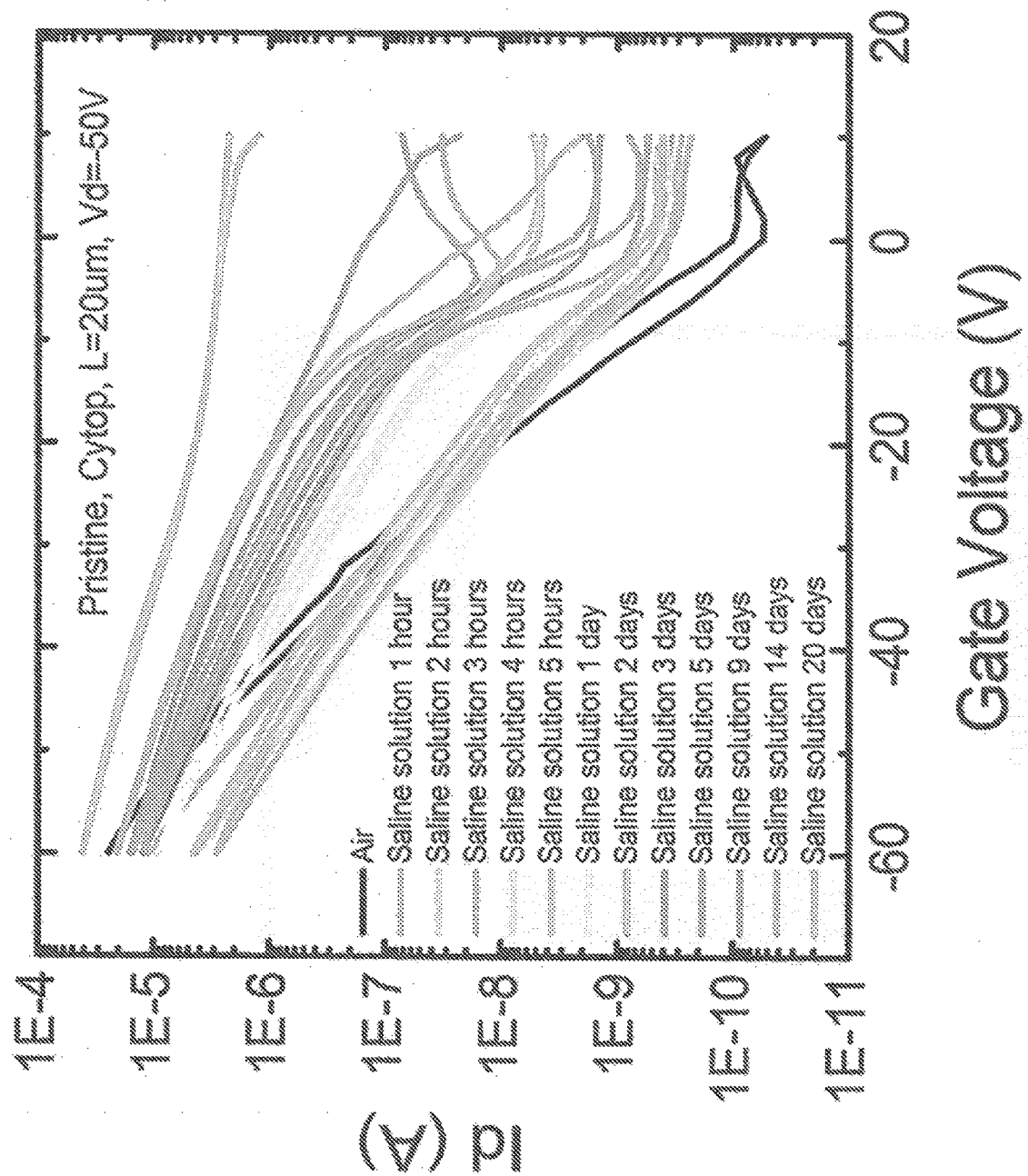
Figure 4b-i

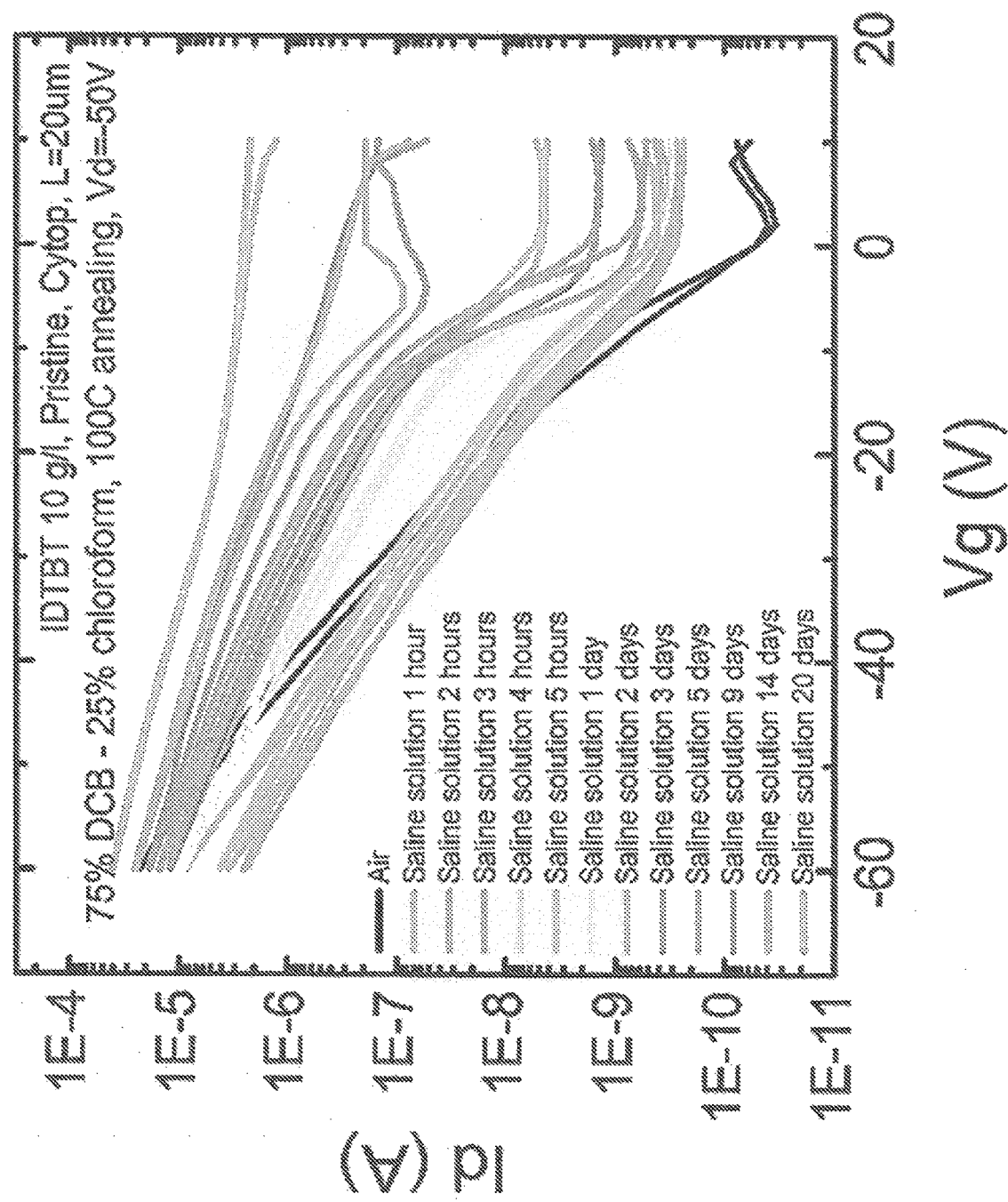
Figure 4b-ii

AQUEOUS MEDIA SENSOR

CROSS REFERENCE TO RELATED APPLICATIONS

This application is a National Stage of International Application No. PCT/EP2017/083797 filed Dec. 20, 2017, claiming priority based on British Patent Application No. 1621828.1 filed Dec. 21, 2016.

Devices for detecting target species or measuring the concentration of a target species in an aqueous media have use in e.g. bio-sensors.

Organic semiconductors are attracting interest for sensor applications because of the increased possibilities to achieve flexible devices or stretchable devices that can be in direct contact with the skin.

Stability of the organic semiconductor in an aqueous media environment is one important practical requirement for aqueous media sensor devices based on organic semiconductors.

The inventors for the present application have tested the stability of organic semiconductors in aqueous media, and have made several surprising findings that facilitate the provision of good aqueous media sensors.

The present invention provides a sensor device for detecting a target species in an aqueous media and/or measuring the concentration of a target species in an aqueous media, the sensor device comprising: (a) an active semiconductor comprising an organic semiconductor material that exhibit substantially the same transfer curve for a period of at least 24 hours when first exposed to air; and (b) a structure for directing an aqueous media into contact with the sensor device.

According to one embodiment, the organic semiconductor material exhibits no more than about a 10% change in on-current ($I_{on}$) for a period of at least 24 hours when first exposed to air.

According to one embodiment, the organic semiconductor material is one that exhibits an on-off ratio of at least 10,000, where the on-off ratio refers to the ratio between the maximum and minimum source-drain currents in the full transfer curve for a field-effect transistor including the organic semiconductor material capacitively coupled to a gate electrode via a conventional gate dielectric such as Cytop or $SiO_2$. As mentioned in more detail below, we note that the sensor device may not necessarily include such a conventional gate dielectric, and/or that the sensor device may not necessarily be operated at a range of gate voltages over which the full transfer curve is exhibited.

According to one embodiment, the organic semiconductor material comprises a mixture of a polymer semiconductor and a small molecule organic compound comprising at least one electronegative group having a ranking of higher than 2 on the Pauling scale.

According to one embodiment, the small molecule organic compound comprises at least one nitrile group and/or at least one fluorine group.

According to one embodiment, the small molecule organic compound comprises one or more aromatic quinone-derivative compounds comprising one or more =C(CN)$_2$ groups, and/or one or more alicyclic organic compounds comprising cross-conjugated exocyclic C=C double bonds and one or more =C(CN)$_2$ groups.

According to one embodiment, the small molecule organic compound comprises one or more of: F4-TCNQ, TCNQ, F6-TCNNQ, F2-TCNQ and CN6-CP.

There is also provided a sensor device for detecting a target species in an aqueous media and/or measuring the concentration of a target species in an aqueous media, the sensor device comprising: (a) an active semiconductor comprising a mixture comprising an organic semiconductor and an organic compound comprising one or more electronegative groups having a ranking higher than 2 on the Pauling scale; and (b) a structure for directing an aqueous media into contact with the sensor device.

According to one embodiment of the sensor device, the organic compound comprises at least one nitrile group and/or at least one fluorine group.

According to one embodiment, the active semiconductor forms part of a field effect transistor, and the structure (b) directs an aqueous media into a region where the aqueous media forms a gate dielectric of the field effect transistor in contact with both the active semiconductor and a gate electrode of the field effect transistor.

According to one embodiment, the active semiconductor forms part of a bottom-gate field effect transistor, and the structure (b) directs an aqueous media into contact with the active semiconductor.

There is also provided a sensor system including a sensor device as described above, and electrical circuitry configured to determine detection of the target species or determine a concentration of the target species based on an electrical response of the sensor device.

There is also provided a method comprising: using for the active semiconductor of a sensor whose operation involves contacting the sensor with an aqueous media, an organic semiconductor material that exhibits substantially the same transfer curve for a period of at least 24 hours when first exposed to air.

There is also provided a method comprising: using for the active semiconductor of a sensor whose operation involves contacting the sensor with an aqueous media, an organic semiconductor material comprising a mixture comprising an organic semiconductor and an organic compound including one or more electronegative groups having a ranking on the Pauling scale of higher than 2.

There is also provided a method comprising: detecting a target species in aqueous media and/or measuring the concentration of a target species in aqueous media, using a sensor device whose operation involves contacting the sensor device with the aqueous media, wherein the active semiconductor comprises an organic semiconductor material that exhibits substantially the same transfer curve for a period of at least 24 hours, when first exposed to air.

There is also provided a method, comprising: detecting a target species in aqueous media and/or measuring the concentration of a target species in aqueous media, using a sensor device whose operation involves contacting the sensor device with the aqueous media, wherein the active semiconductor comprises a mixture comprising an organic semiconductor material and an organic compound including one or more electronegative groups having a ranking on the Pauling scale of higher than 2.

There is also hereby provided a method comprising: using, for the active semiconductor of a sensor device whose operation comprises contacting the sensor device with an aqueous media comprising ionic species in a higher concentration than a target species, an organic semiconductor material that exhibits substantially the same transfer curve for a period of at least 24 hours when first exposed to air.

There is also provided a method comprising: using, for the active semiconductor of a sensor device whose operation comprises contacting the sensor device with an aqueous media comprising ionic species in a higher concentration than a target species, an organic semiconductor material that comprises a mixture comprising an organic semiconductor and an organic compound including one or more electronegative groups having a ranking on the Pauling scale of higher than 2.

According to one embodiment, the operation of the sensor device comprises contacting the active semiconductor with the aqueous media.

There is also provided a method, comprising: detecting a target species and/or measuring the concentration of the target species in an aqueous media further comprising ionic species in a higher concentration than said target species, using a sensor device whose operation comprises contacting the active semiconductor with an aqueous media, wherein the active semiconductor comprises an organic semiconductor material that exhibits substantially the same transfer curve for a period of at least 24 hours when first exposed to air.

There is also provided a method, comprising: detecting a target species and/or measuring the concentration of the target species in an aqueous media further comprising ionic species in a higher concentration than said target species, using a sensor device whose operation comprises contacting the sensor device with an aqueous media, wherein the active semiconductor comprises a mixture comprising an organic semiconductor and an organic compound including one or more electronegative groups having a ranking on the Pauling scale of higher than 2.

According to one embodiment, the operation of the sensor device comprises contacting the active semiconductor with the aqueous media.

There is also hereby provided a method, comprising: detecting a target species in aqueous media and/or measuring the concentration of a target species in aqueous media, using a sensor device whose operation involves contacting an organic semiconductor of the sensor device with the aqueous media, wherein the organic semiconductor is an organic semiconductor that exhibits less than 30% variation in current through the organic semiconductor for at least the final 400 minutes of a 500 minute period of operation in a transistor comprising a gate dielectric consisting of a static volume of deionised water, a gate electrode biased at an on voltage that does not trigger electrolysis, and source-drain electrodes at a potential difference of 1V.

Embodiments of the present invention are described in detail hereunder, by way of example only, with reference to the accompanying drawings, in which:

FIG. 1 schematically illustrates the testing of organic field-effect transistor (OFET) devices in aqueous media, with the organic semiconductor exposed to the aqueous media at the lateral edges of the immersed device;

FIG. 4 shows the measured performance in a 9 g/L saline solution of (a) an OFET including an organic semiconductor (OSC) used in a sensor device according to an embodiment of the present invention, and (b) an OFET including a comparative example of a OSC;

Figure 8:
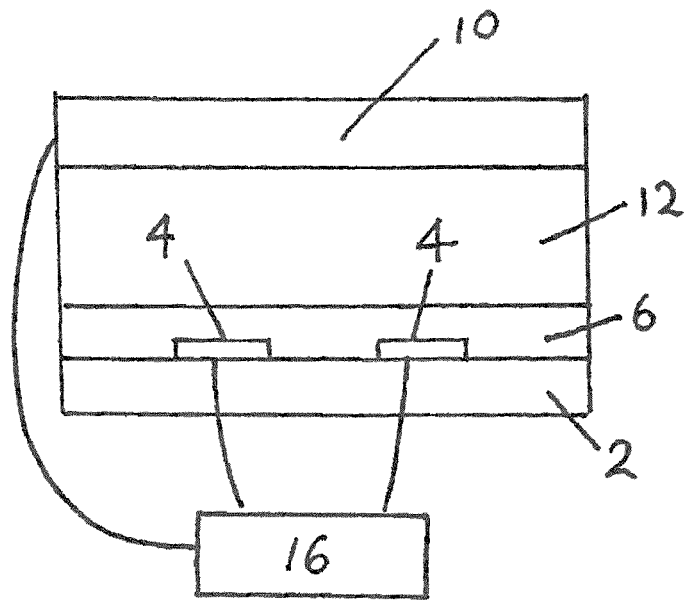
Figure 9:
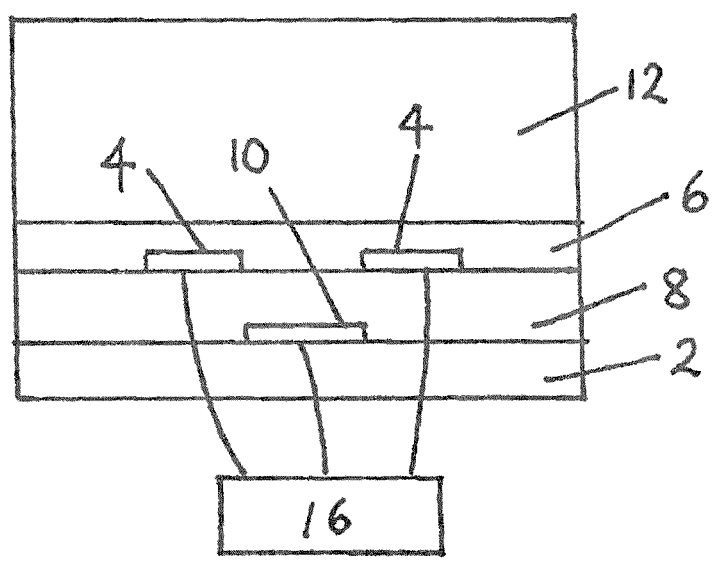

FIG. 8 schematically illustrates one example of a sensor system according to an embodiment of the present invention, in which the OSC is exposed to aqueous media and changes in current through the semiconductor channel of the FET structure arise when target species bind to the gate electrode of the FET structure; and FIG. 9 schematically illustrates another example of a sensor system according to an embodiment of the present invention, in which the OSC is exposed to aqueous media and changes in current through the semiconductor channel of the FET structure arise when target species bind to OSC.

Figure 10:
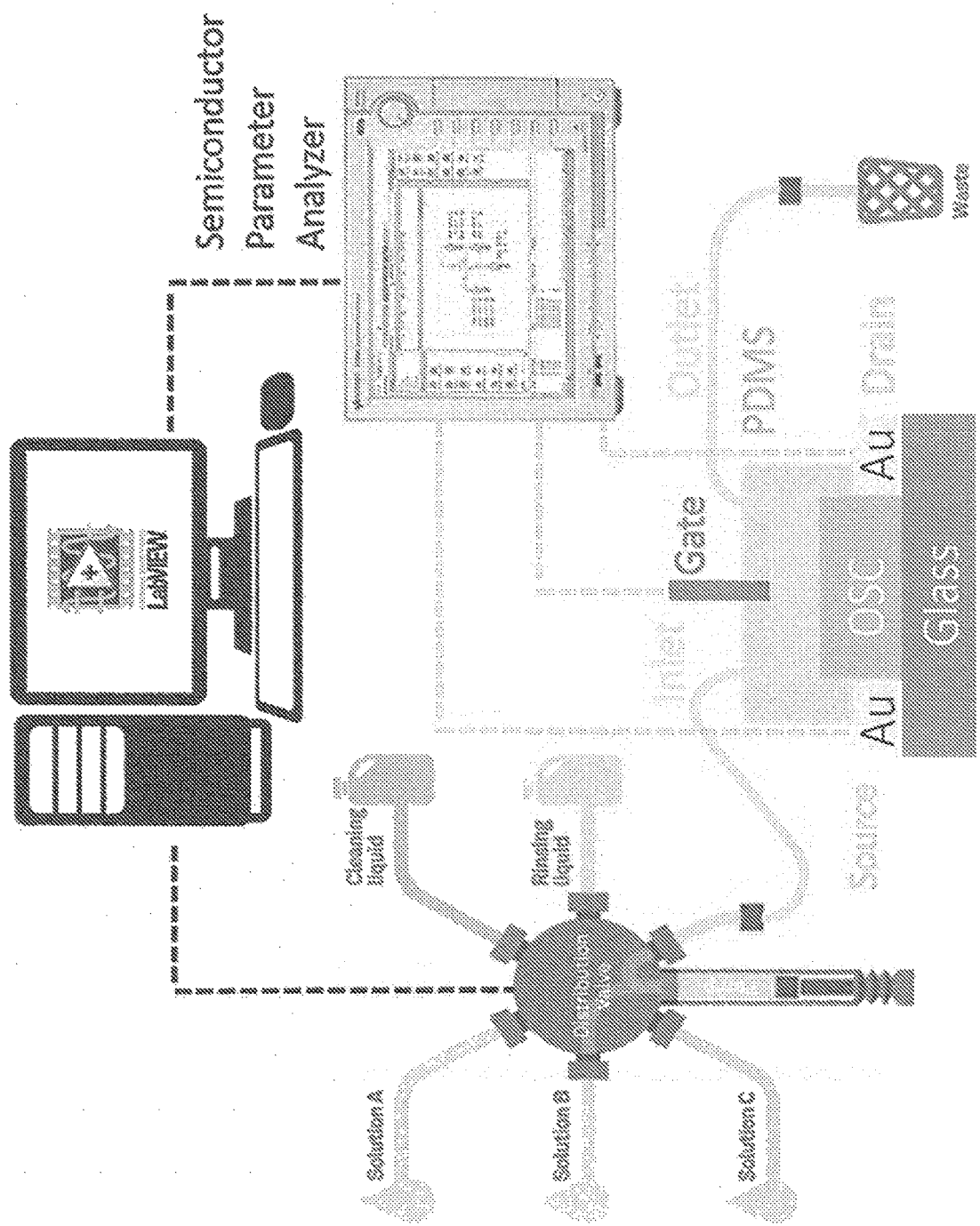

FIG. 10 illustrates an example of a set up for testing the response of the sensor system of FIG. 9 to different test liquids.

Figure 11A:
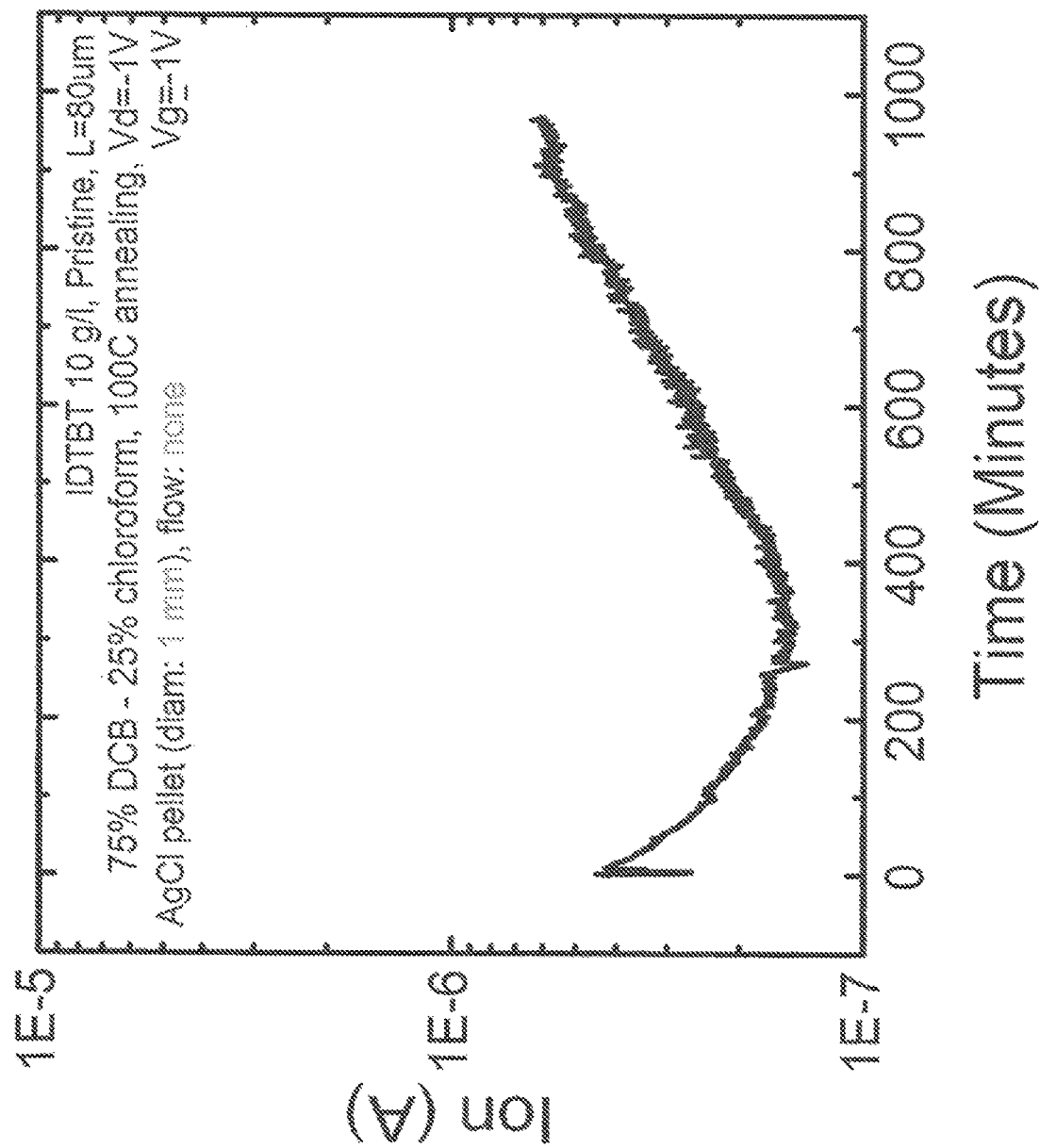
Figure 11B:
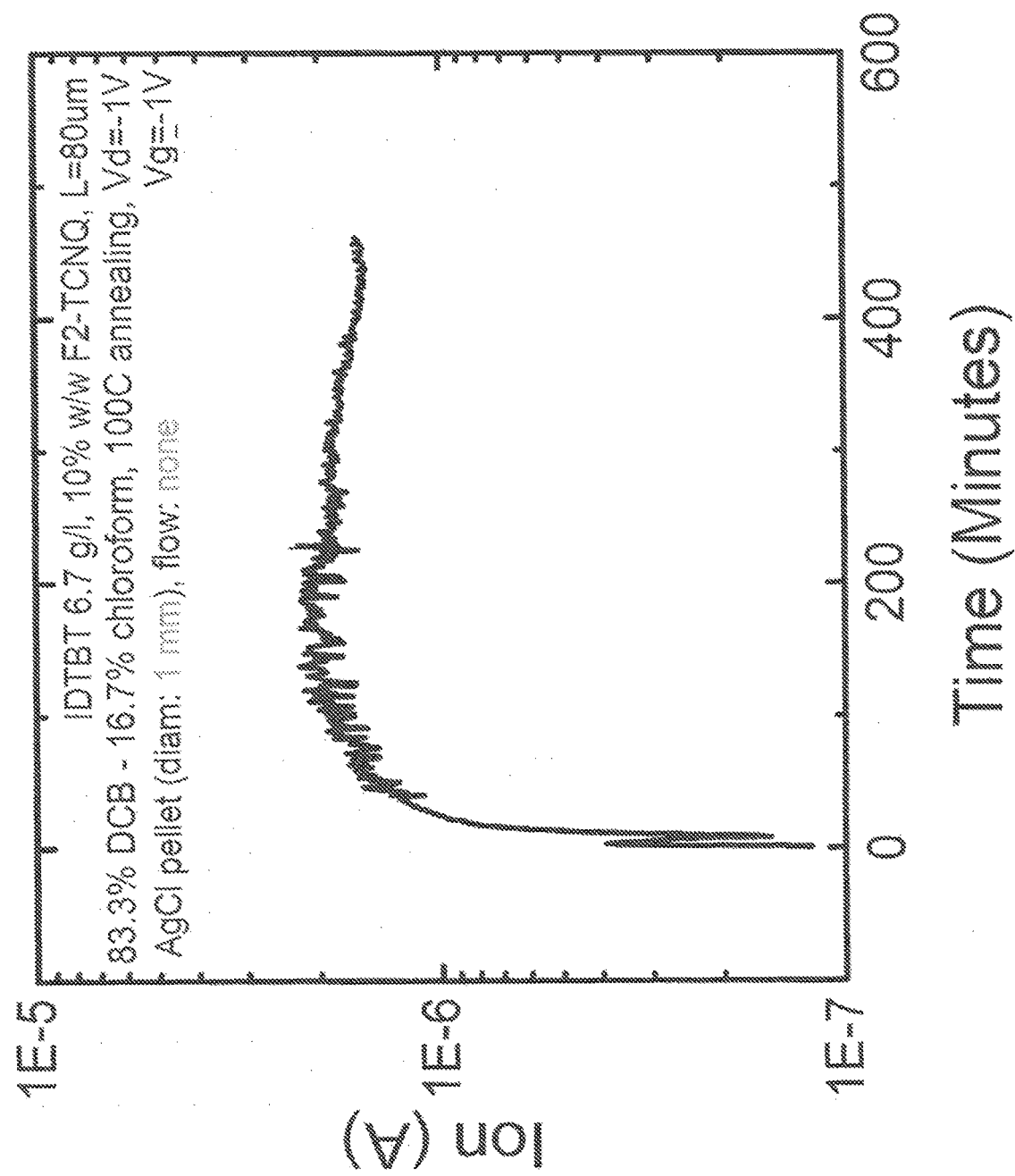

FIGS. 11a and 11b illustrate source-drain current ($I_{on}$) measurements when pumping deionised (DI) water through a flow cell using pristine IDTBT (FIG. 11a) and after introducing deionised water into a flow cell using IDTBT and TCNQ additive (FIG. 11b).

Figure 12:
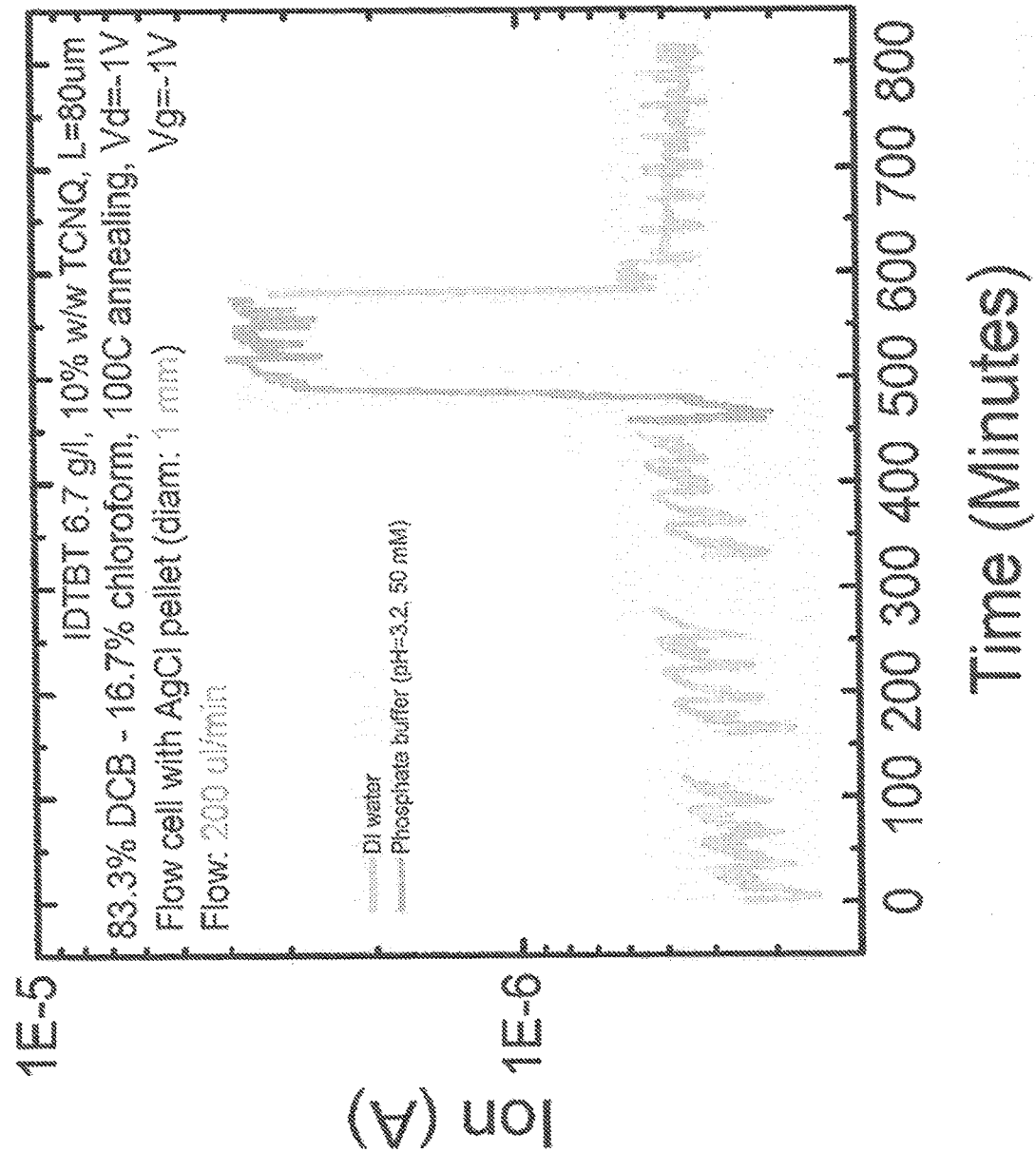

FIG. 12 illustrates source-drain current ($I_{on}$) measurements for a flow cell using IDTBT and TCNQ additive, when switching the fluid pumped through the flow cell from deionised water to an example analyte, and then back again to deionised water.

Figure 1A:
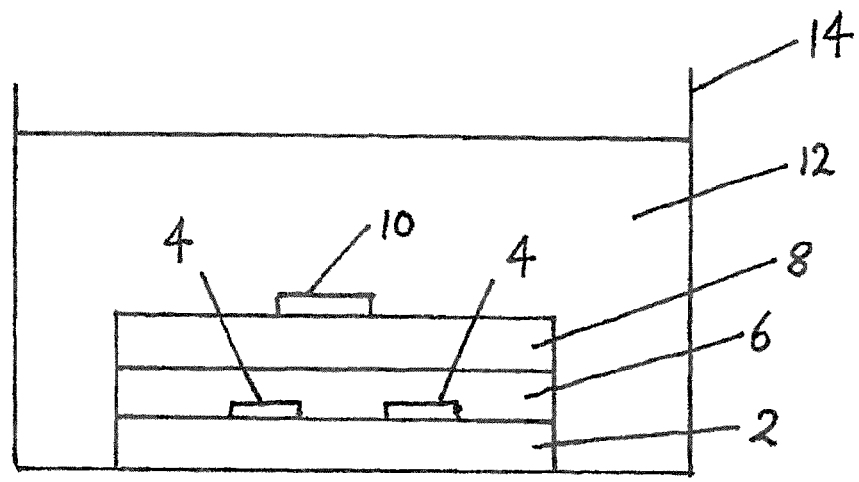
Figure 1B:
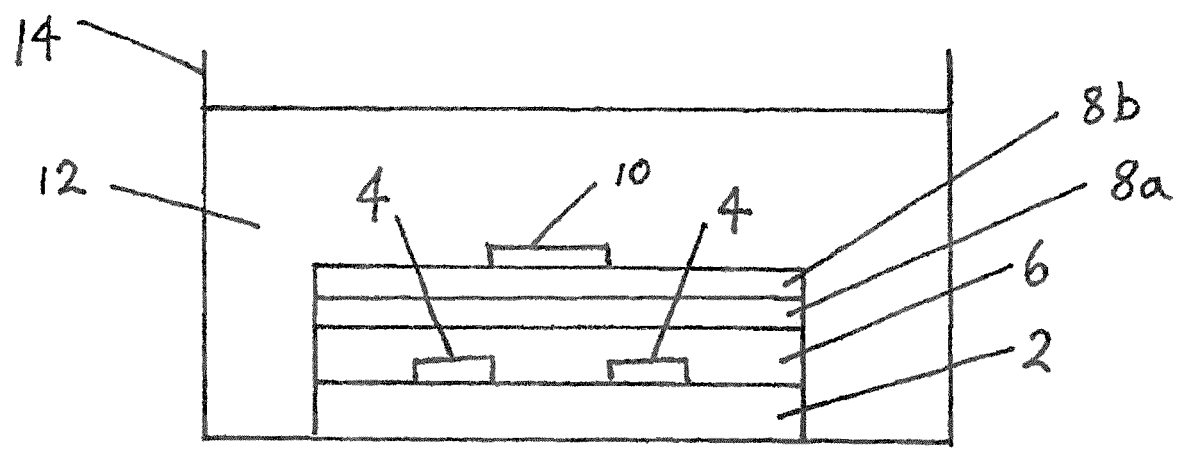

With reference to FIGS. 1a and 1b, the stability in aqueous solutions of various organic semiconductors was tested by immersing OFET devices in aqueous media 12 held in a container 14, for a period of 28 days, and performing measurements of the transfer curve at different times during the 28 day period. The transfer curve measurement involves maintaining the voltage across the gold source and drain electrodes 4 (supported on a substrate 2 and separated by a channel length L of 20 microns) at a constant value e.g. 50V, and measuring the change in current ($I_d$) between the source/drain electrodes (via the organic semiconductor 6 deposited over the source/drain electrodes), as the voltage applied to a gold gate electrode 10 (capacitively coupled to the semiconductor 4 via a gate dielectric 8 formed over the organic semiconductor) is swept across a range of voltages, e.g. from −60V to +10V.

Figure 2A:
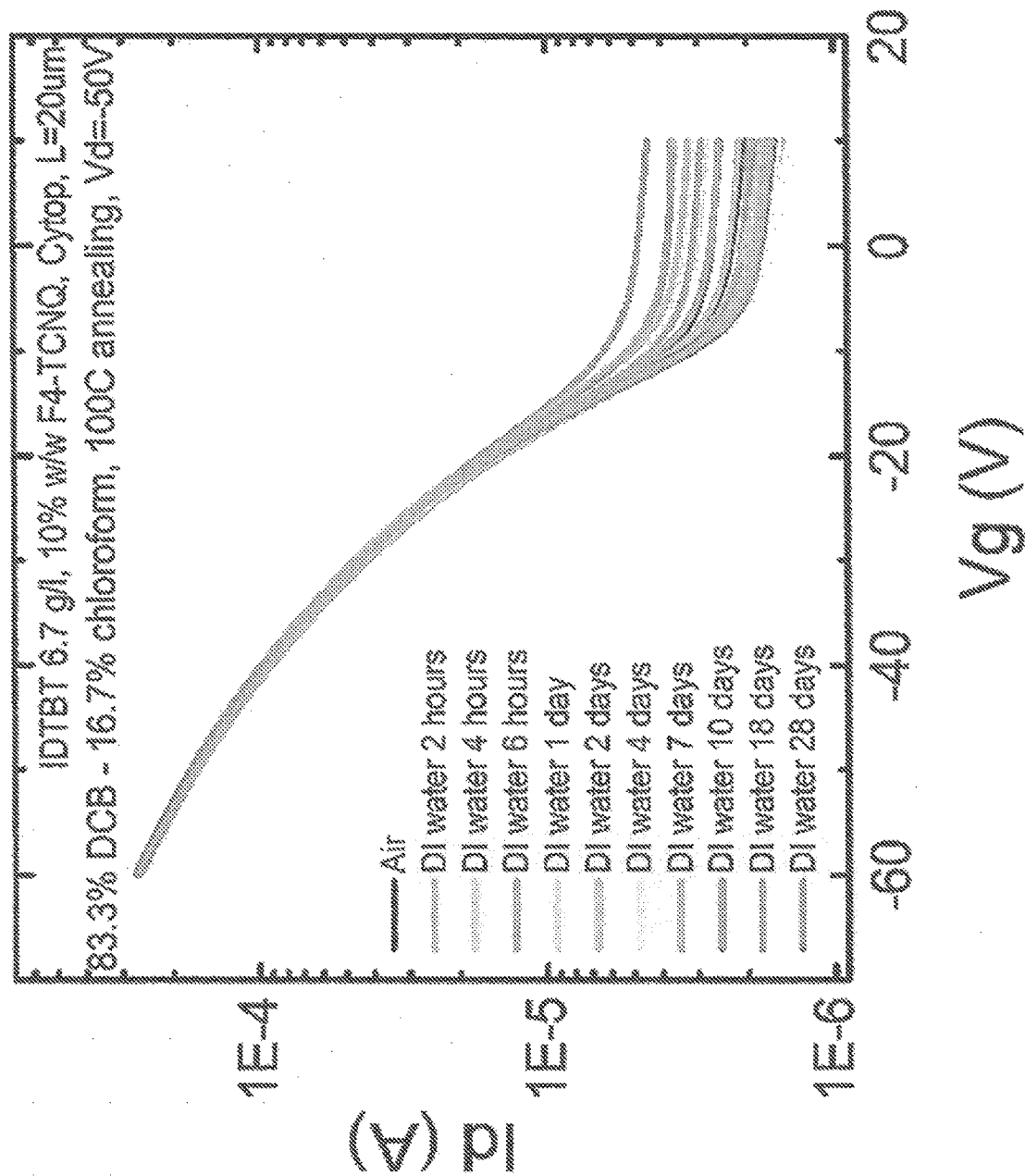
FIG. 2 shows the measured performance in distilled water of (a) an OFET including an organic semiconductor (OSC) used in a sensor device according to an embodiment of the present invention, and (b) an OFET including a comparative example of a OSC.
Figure 2B:
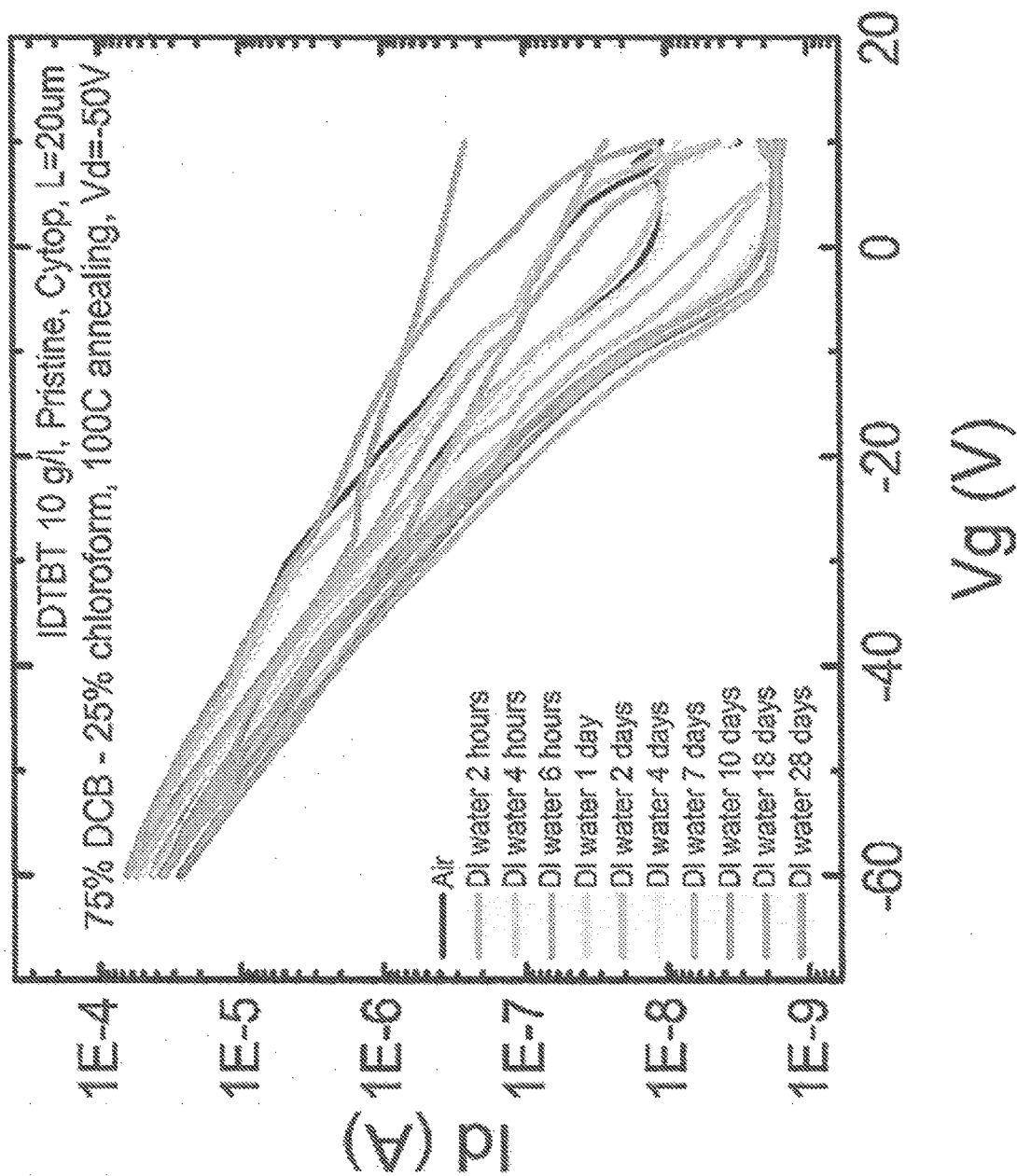
Figure 2C:
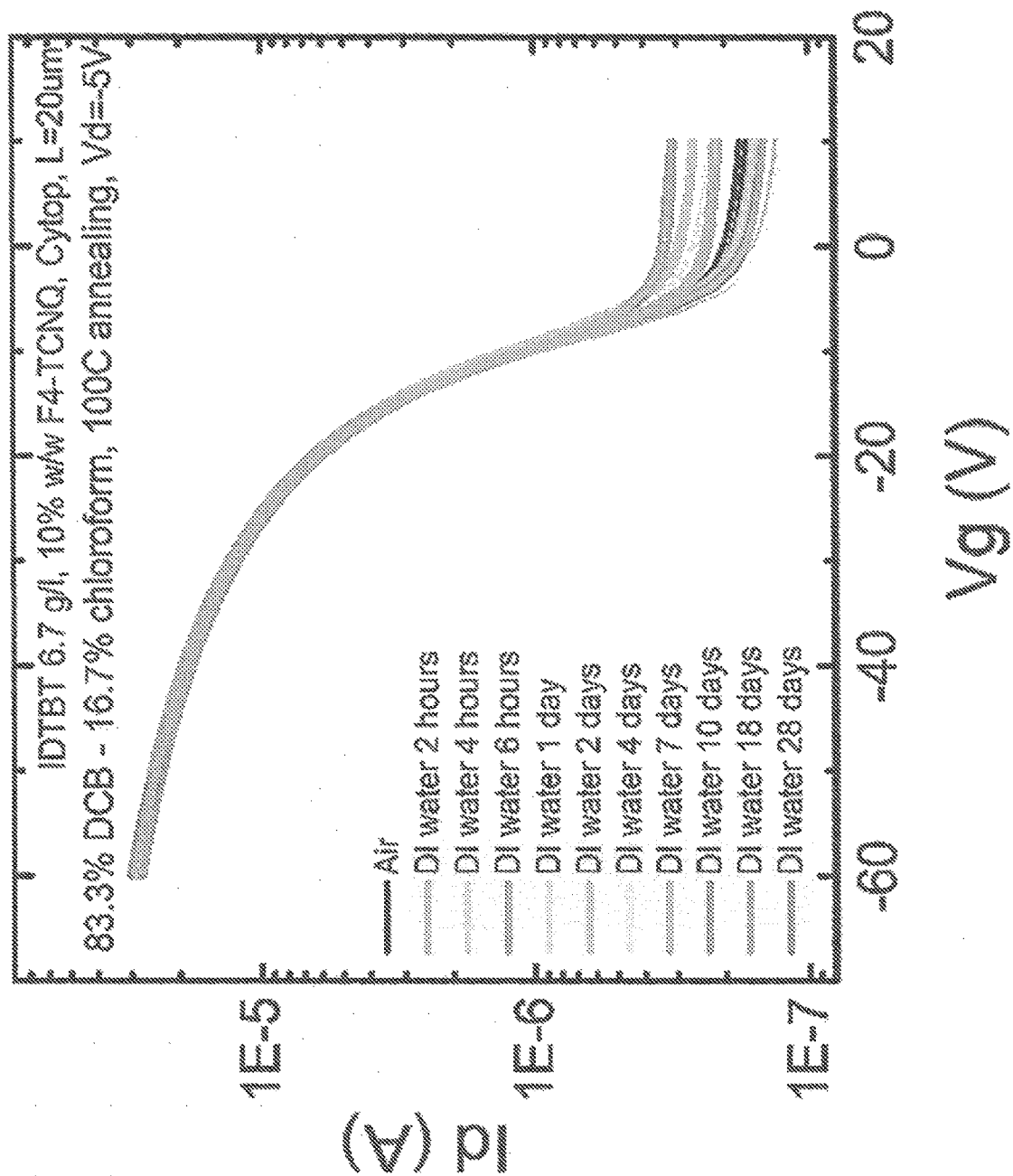
Figure 2D:
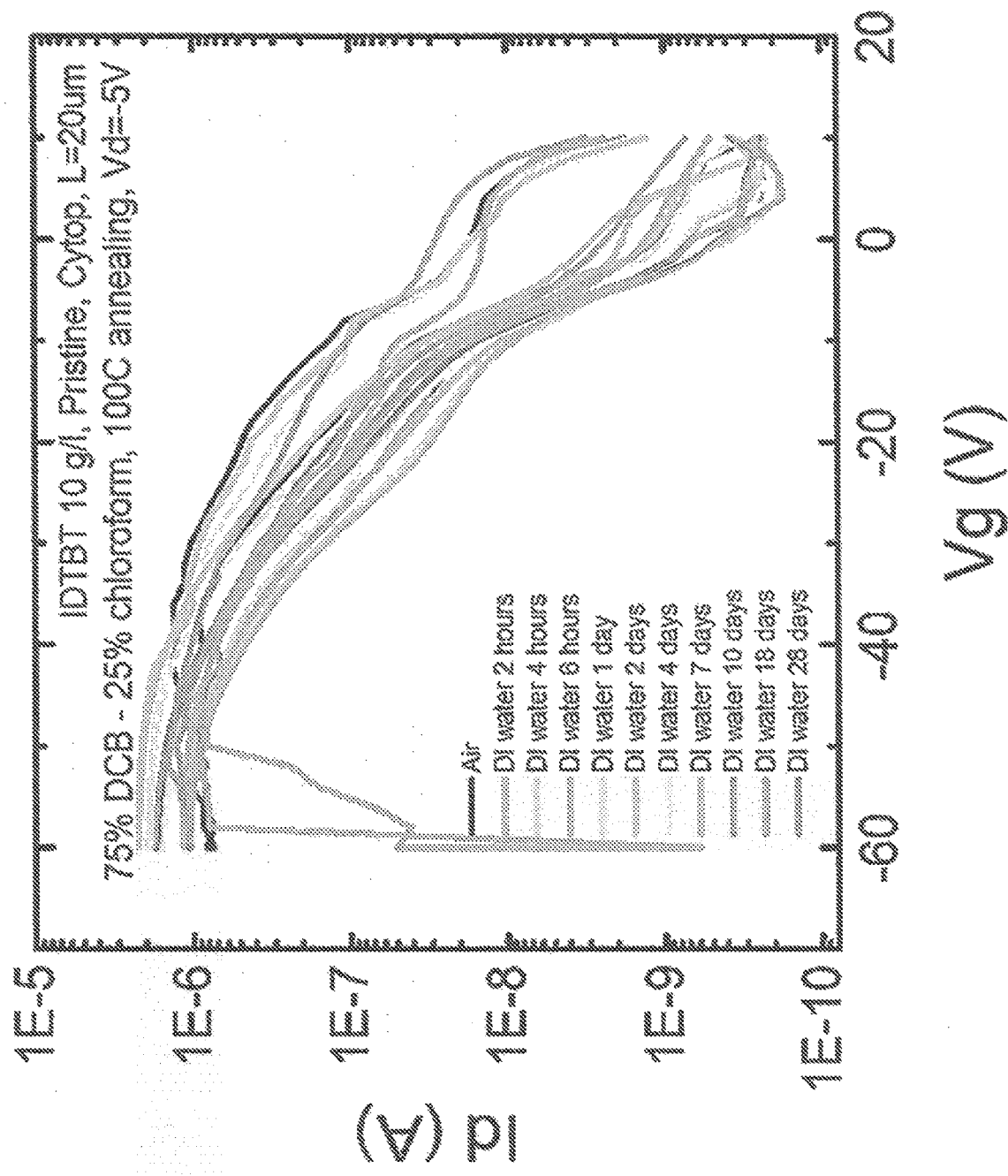

FIGS. 2a and 2c show the measured transfer curves in de-ionised (DI) water for the OFET described above, when using a mixture of IDTBT (shown below) and 10 wt % F4-TCNQ (shown below) for the OSC, and a layer of Cytop® for the gate dielectric. FIGS. 2b and 2d show the measured transfer curves in de-ionised (DI) water for the OFET described above when using IDTBT alone (hereafter referred to as "pristine IDTBT") for the OSC, and a layer of Cytop® for the gate dielectric. In each case, the OSC was deposited from solution in a solvent mixture of dichlorobenzene (DCB) and chloroform (83.3% DCB-16.7% chloroform) and annealing was carried out at 100° C. FIGS. 2a and 2b show the measured transfer curves for a source/drain voltage of 50V, and FIGS. 2c and 2d show the measured transfer curves for a source/drain voltage of 5V.

IDTBT
(poly-indaceno-dithiophene-co-benzothiadiazole)

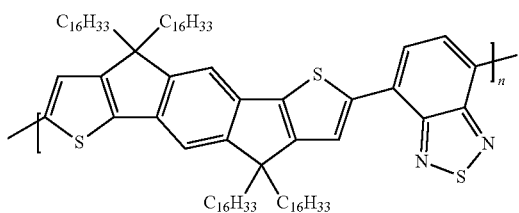

F4-TCNQ (2,3,5,6-Tetrafluoro-7,7,8,8-tetracyano-quinodimethane)

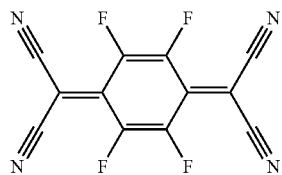 [SMILES: N#CC(C#N)=c1c(F)c(F)c(=C(C#N)C#N)c(F)c1F]

Cytop®

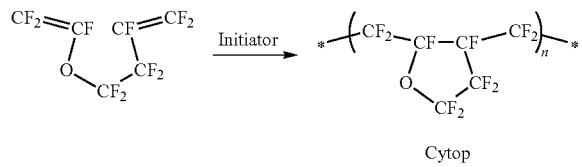

Cytop

As shown in FIG. 2b, the comparative example using pristine IDTBT for the OSC degraded over the 28 days, with a reduction of about 80% in the "on" current ($I_{on}$) measured at gate voltage=−60V. The comparative example also exhibited hysteresis (which is an indication of trapped states), and a deterioration in the shape of the transfer curve, resulting in a substantially linear gate voltage vs. source-drain current characteristic after 3 days. The comparative example also exhibited an increase in "off" current ($I_{off}$) measured at gate voltage=+10V, and a fluctuation in onset voltage (threshold voltage) from −5V to −8V.

In contrast, the OFET whose performance is shown in FIG. 2a exhibited stable performance for the whole test period of 28 days. In particular, the value of $I_{on}$ remained substantially constant over the whole test period of 28 days, and the transfer curve exhibited substantially the same shape over the whole test period of 28 days. The change in onset voltage was relatively small, changing by only 1V from −8V to −9V.

The same contrast was observed at the lower source-drain voltage (FIGS. 2c and 2d). Over the test period of 28 days, the comparative example (FIG. 2d) exhibited (i) an increase in $I_{on}$ by about one order of magnitude, (ii) an increase in $I_{off}$ by about three orders of magnitude, and (iii) a deterioration in the transfer curve to a substantially linear gate voltage vs. source-drain current characteristic. In contrast, the OFET comprising a mixture of IDTBT and F4-TCNQ (FIGS. 2a and 2c) exhibited equally good stability at both high and low source-drain voltages.

The same good stability for the OFET comprising a mixture of IDTBT and F4-TCNQ (5 wt. %) was also exhibited during testing in tap water including a significant concentration of ionic species. The results of two different experiments with the same experimental parameters are shown in FIGS. 3a-i and 3a-ii. With reference to FIG. 3a-i, $I_{on}$ remained stable for three days and $I_{off}$ decreased by about three orders of magnitude. The decrease in off-current in the experiment of FIG. 3a-i is attributed to the tap water used for that experiment containing anionic species that capture holes in the IDTBT, and thus reduce the total concentration of free carriers in the IDTBT (de-doping the IDTBT). The onset voltage decreased from −8V to −3V, and no hysteresis was observed.

Figure 3B:
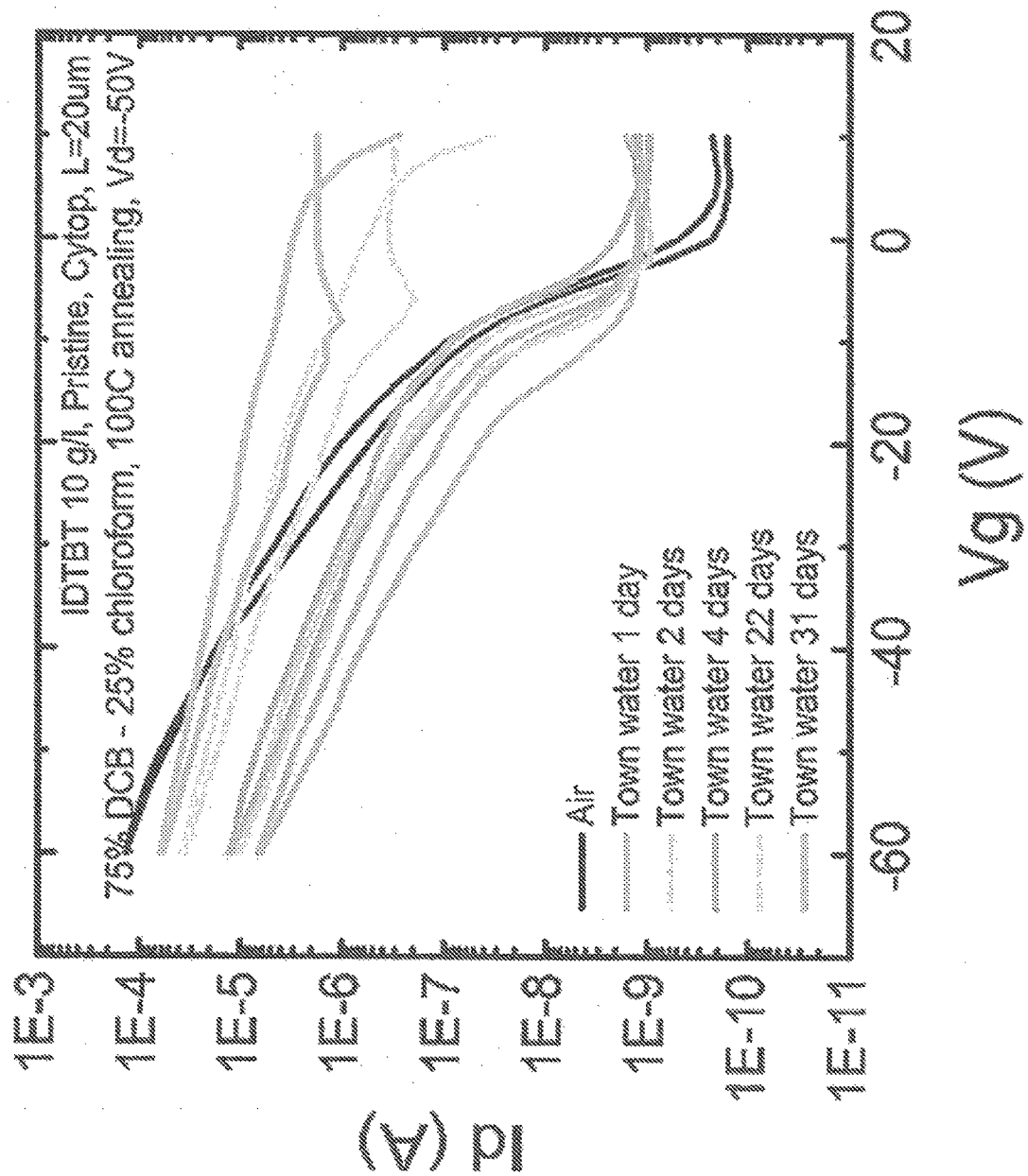
FIG. 3 shows the measured performance in tap water including a low concentration of ionic species of (a) an OFET including an organic semiconductor (OSC) used in a sensor device according to an embodiment of the present invention, and (b) an OFET including a comparative example of a OSC.

By way of comparison, FIG. 3b shows transfer curve measurements for the same OFET but without F4-TCNQ additive (pristine IDTBT).

Even more surprisingly, good stability was also observed for the OFET comprising a mixture of IDTBT and F4-TCNQ in a sterilised 9 g/L saline solution (having a comparable concentration of ionic species to blood). Two transfer curve measurements were made for the same transistor on each measurement day; FIG. 4b-i shows the first transfer curve measurements for each measurement day, and FIG. 4b-ii shows the second transfer curve measurements for each measurement day. With reference to FIGS. 4b-i and 4b-ii: over the first 3 hours of immersion in the saline solution, the OFET comprising pristine IDTBT exhibited a decrease in $I_{on}$ of more than 90%, an onset voltage shift from about 0V to about −3V, an increase in the sharpness of the transfer curve, and an increase in $I_{off}$ of about one order of magnitude. A different trend emerged subsequently: $I_{on}$ started increasing (an increase of about one order of magnitude after 5 days), and $I_{off}$ also increased by about two orders of magnitude, but the transfer curve continued to become sharper. The onset voltage shifted from about −1V to about −5V, and hysteresis was exhibited after 3 days. After 20 days of immersion in the saline solution, $I_{off}$ had increased by about 5 orders of magnitude, and $I_{on}$ was higher than at the start of the test before the OFET was exposed to the saline solution.

In contrast, FIGS. 4a-i and 4a-ii show how the OFET comprising a mixture of IDTBT and F4-TCNQ exhibited much greater stability in the saline solution. Again, two transfer curve measurements were made for the same transistor on each measurement day; FIG. 4a-i shows the first transfer curve measurements for each measurement day, and FIG. 4a-ii shows the second transfer curve measurements for each measurement day. After 5 days in the saline solution, there was little change in $I_{on}$ and the threshold voltage, and little change in the shape of the transfer curve. It was only after 20 days immersion in the saline solution that this OFET showed the first signs of significant degradation, which is attributed to roughening of the semiconductor-dielectric interface due to salt ions and swelling.

Figure 5A:
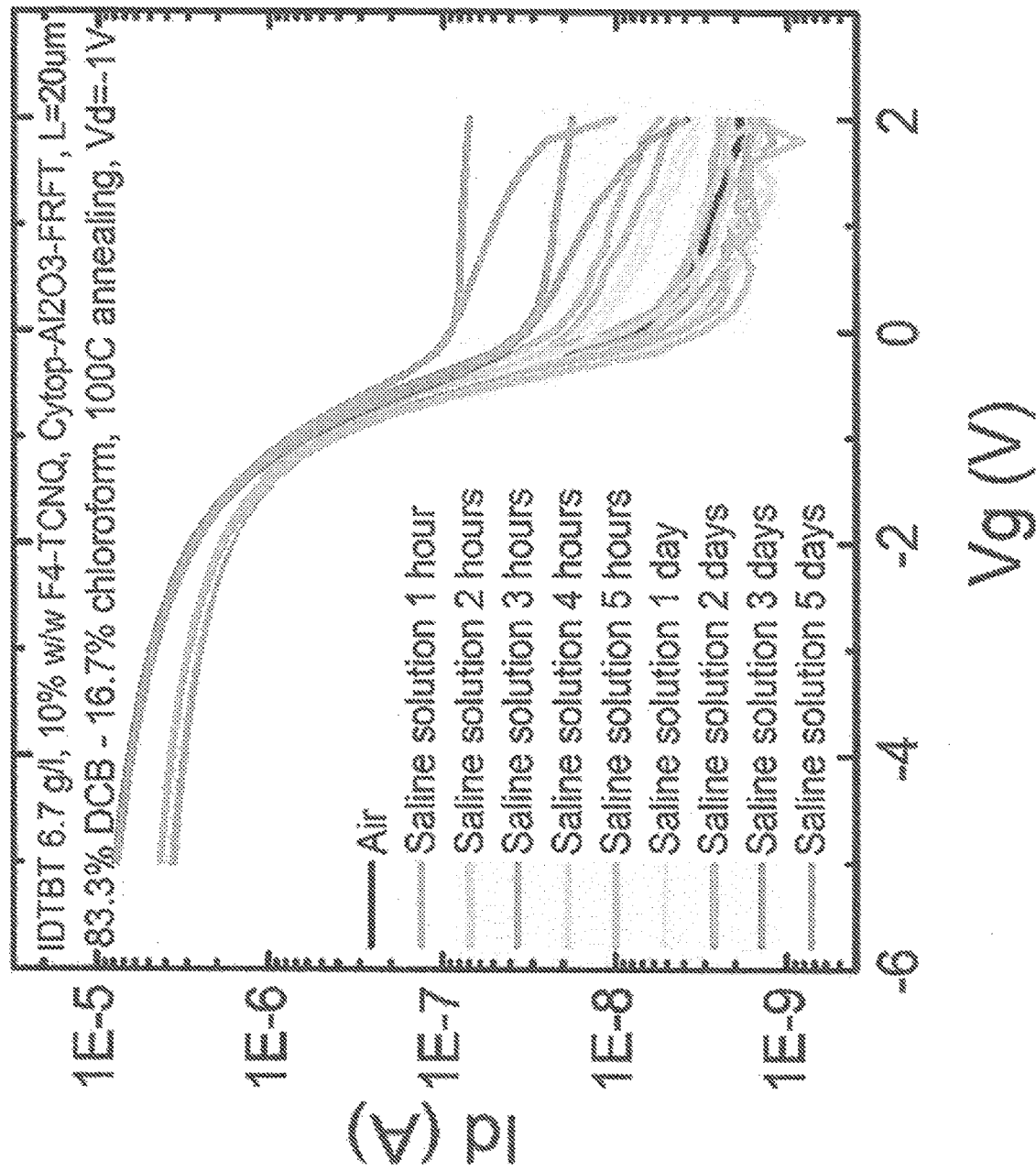
FIG. 5 shows the measured performance in a sterilised 9 g/L saline solution of (a) further examples of OFETs including organic semiconductors (OSC) used in a sensor device according to an embodiment of the present invention; and (b) a comparative example of an OFET.
Figure 5B:
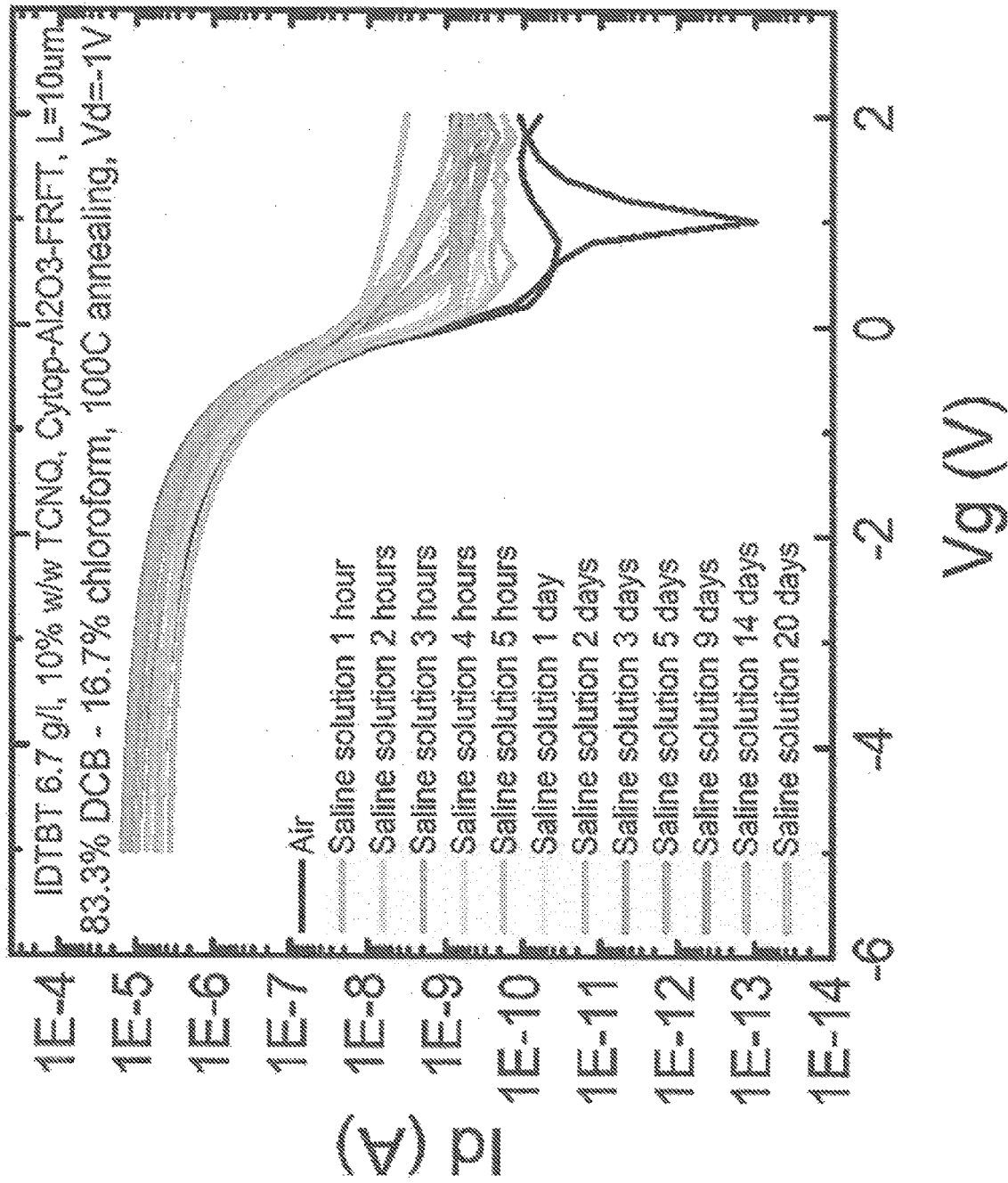
Figure 5C:
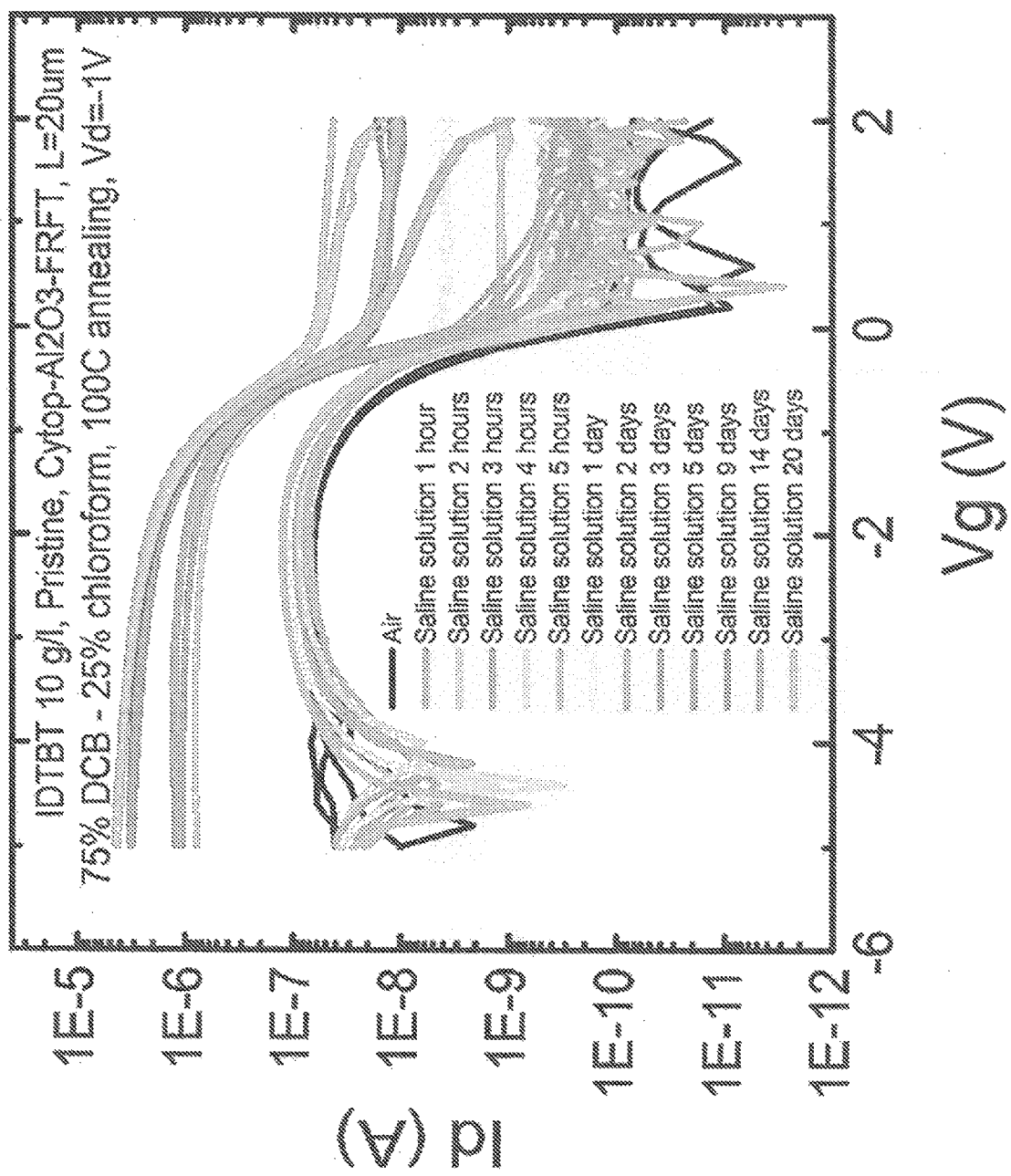

A comparison of the results shown in the graphs of FIGS. 5a, 5b and 5c also indicates good stability in the same saline solution for OFETs comprising a mixture of IDTBT and either F4-TCNQ (FIG. 5a) or TCNQ (shown below) (FIG. 5b), compared to a OFET comprising pristine IDTBT (FIG. 5c).

TCNQ (7,7,8,8-Tetracyanoquinodimethane)

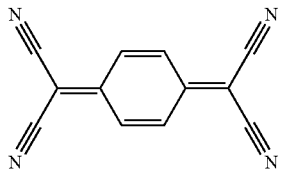

With reference to FIG. 1b, the structure of the OFET devices used in the tests whose results are shown in FIG. 5 is the same as that of the OFET used in the tests described above, except that the gate dielectric 8 comprised a 25 nm layer 8a of Cytop® over the semiconductor, a 0.5 nm Al₂O₃ layer (not shown) over the Cytop® layer, and a 210 nm high-K layer (8b) of a fluorinated relaxor ferroelectric terpolymer (FRFT or P(VDF-TrFE-CFE)) available commercially from Piezotech SAS. The Al₂O₃ layer was included to improve adhesion between the Cytop® layer 8a and the FRFT layer 8b. Such dielectric bilayer stacks are useful for decreasing the operating voltage of OFETs to levels (e.g. less than 1V) suited to some bio-sensing applications. The tests whose results are shown in FIG. 5 involved immersing the OFETs in the saline solution for a test period, and making transfer curve measurements at different times within the test period. In the tests of FIG. 5, the transfer curve measurements involved measuring the current between the source and drain electrodes 4, while maintaining a voltage of −1V across the source and drain electrodes, and sweeping the gate voltage over a range from −5V to +2V.

With reference to FIG. 5c, the OFET comprising the pristine IDTBT exhibited leakage, indicated by dips in the source-drain current. After one day immersion in the saline solution, $I_{off}$ had increased by about one order of magnitude, and $I_{on}$ had increased so much that leakage was quenched. In contrast, the OFET comprising a mixture of IDTBT and F4-TCNQ or TCNQ (FIGS. 5a and 5b) remained stable in the saline solution over a period of 5 hours. There was significantly less fluctuation in $I_{on}$ and $I_{off}$, compared to the OFET comprising pristine IDTBT (FIG. 5c).

Without wishing to be bound by theory, the inventors for the present application consider that the F4-TCNQ and TCNQ function to generally stabilize the transistor characteristics and neutralise electrochemical doping of the organic semiconductor by the ions in the saline solution, and thereby stabilise the performance of the OFET in the saline solution.

This observed stability in de-ionised water, tap water, and particularly saline solution, makes these organic semiconductors suitable for use in sensors operating in aqueous media, such as e.g. bio-sensors for detecting or measuring the concentration of target species in biological environments such as e.g. in blood. In particular, the effect of F4-TCNQ and TCNQ in desensitising the OFET to the presence of ions in the saline solution, makes these OFETs of particular use in detecting or measuring the concentration of target species in environments comprising background ionic species other than the target species, which background ionic species would otherwise make it impossible to reliably correlate the response of the OFET to the concentration of the target species in the environment of the OFET.

Figure 6:
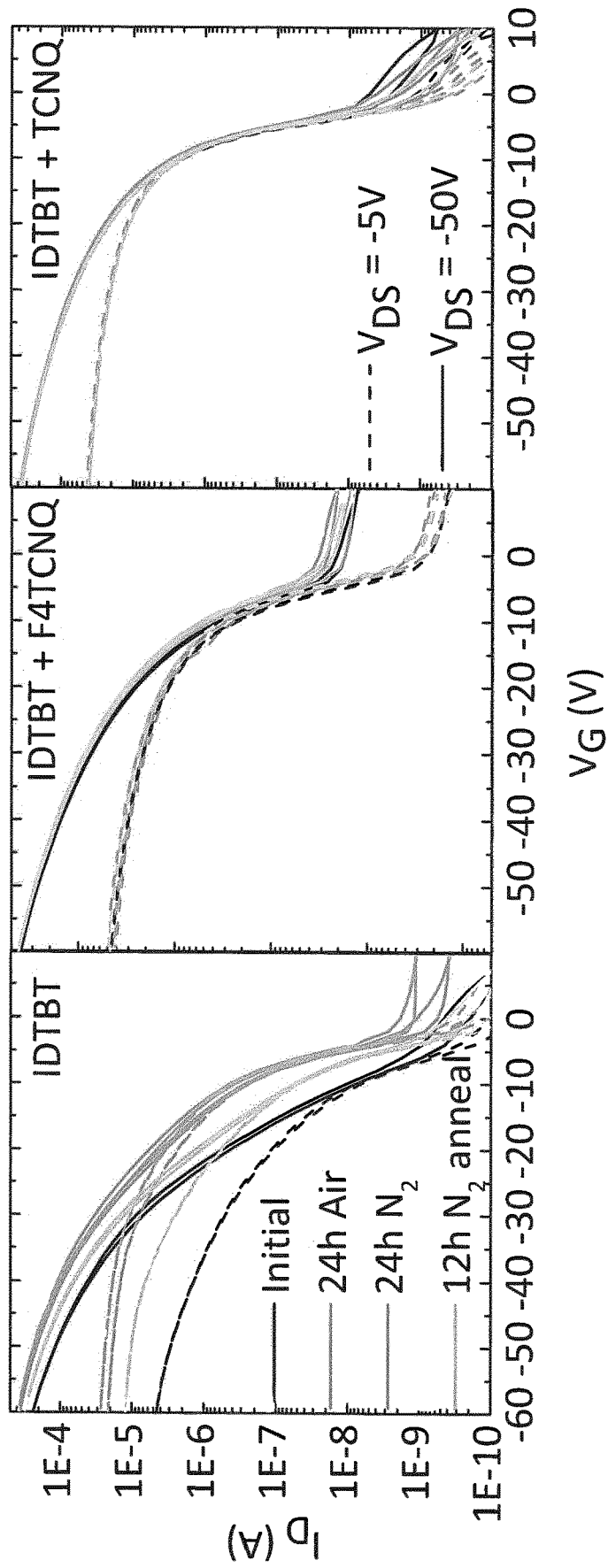
FIG. 6 shows the measured performance in air and nitrogen of OFET devices including the organic semiconductor materials whose performance in aqueous media is shown in FIGS. 2 to 5.

The inventors for the present application have observed a link between stability in aqueous solutions, and stability in air and a substantially pure nitrogen environment. FIG. 6 shows the transfer curves in air and a substantially pure nitrogen of the kind of OFETs whose performance in aqueous solutions is shown in earlier figures, i.e. an OFET comprising pristine IDTBT, an OFET comprising a mixture of IDTBT and F4-TCNQ, and an OFET comprising a mixture of IDTBT and TCNQ. The solid lines show the transfer curves for a voltage of −50V between the source and drain electrodes, and the dashed lines show the transfer curves for a voltage of −5V between the source and drain electrodes.

FIG. 6 shows the measured transistor characteristic immediately after manufacture in a nitrogen environment (black line—bottom of set of 4 lines), after 24 hours exposure to air (blue line—top of set of 4 lines), again after a further 24 hours storage in a nitrogen gas environment (red line—2nd top of set of 4 lines), and finally after annealing overnight in a nitrogen glovebox (green line—2nd bottom of set of 4 lines), consecutively. For the OFET comprising pristine IDTBT, the device characteristics are observed to depend strongly on the atmosphere in which the device is stored and measured. In particular, under conditions where no or little oxygen is present, the device characteristics are degraded as evidenced by a sluggish turn-on characteristics. For the OFETs comprising a mixture of IDTBT and F4-TCNQ or TCNQ, the characteristics are good and independent of the atmosphere in which the devices are stored/measured.

It is striking that the performance of the OFETs comprising IDTBT and F4-TCNQ or TNCQ continue to exhibit substantially identical performance even after 24 hours exposure to air or a substantially pure nitrogen environment, whereas the OFET comprising pristine IDTBT exhibits very different performance after 24 hours exposure to air or exposure to substantially pure nitrogen environments. All of the results described above point to a link between the effect of the F4-TCNQ or TCNQ additive on OFET stability in air and nitrogen, and the effect of the F4-TCNQ or TCNQ additive on OFET stability in aqueous solutions.

The inventors for the present application have extended the stability tests in air for the OFETs comprising a mixture of IDTBT and F4-TCNQ or TCNQ, and have observed that these OFETs exhibit no more than about 10% change in $I_{on}$ over a period of a week or longer.

For further comparison, the inventors for the present application tested the stability in saline solution of the same OFET structure but using pristine F8BT (shown below) for the organic semiconductor.

F8BT
(Poly(9,9-dioctylfluorene-alt-benzothiadiazole))

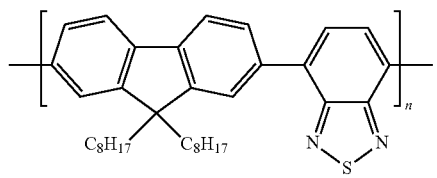

Figure 7:
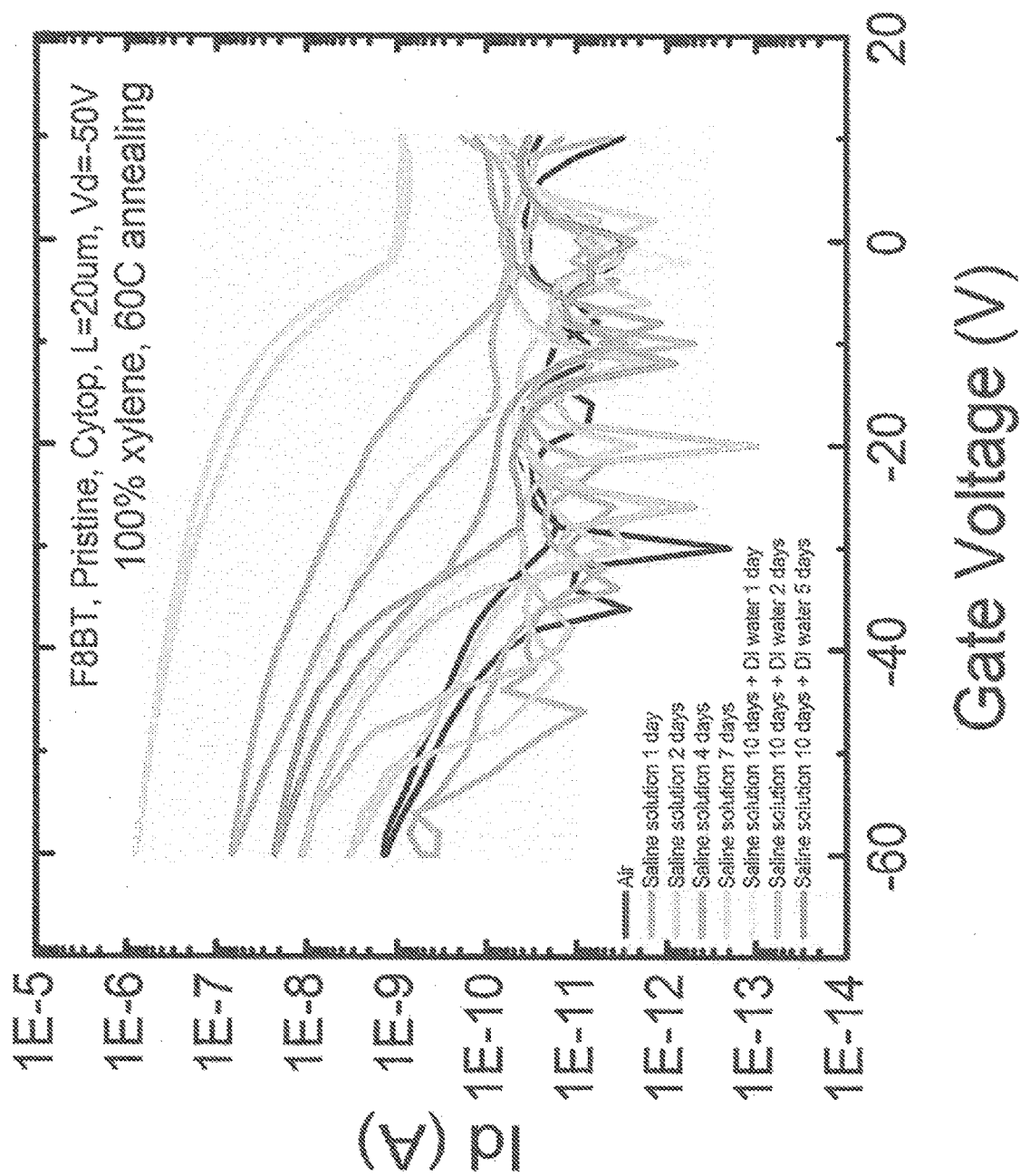
FIG. 7 shows the measured performance in saline solution of a further comparative example of an OFET.

As shown in FIG. 7, the OFET comprising pristine F8BT exhibits pronounced hysteresis, very low $I_{on}$ and a substantially linear gate voltage/source-drain current characteristic. After 7 days immersion in saline solution, $I_{on}$ and $I_{off}$ had increased by about two orders of magnitude, the transfer curve had sharpened, and hysteresis was reduced. After subsequent immersion in DI water, the device performance is observed to return to its original performance. This indicates that the same kind of changes in performance in saline solution of the OFET comprising pristine IDTBT can be attributed to electrochemical doping of the semiconductor by ions in the saline solution, and that the improvement in stability with OFETs comprising a mixture of IDTBT and F4-TCNQ or TCNQ can be attributed to the effect of F4-TCNQ and TCNQ effectively neutralising or preventing electrochemical doping of the semiconductor by ions in the saline solution.

FIG. 8 schematically illustrates an example of a sensor system according to an embodiment of the present invention. A channel for receiving an aqueous solution to be analysed 12 is created between the stable organic semiconductor 6 of the OFET and a conductor 10 to function as a gate electrode. In this example, the aqueous solution functions as the gate dielectric of the OFET, and the binding of any target species in the aqueous solution to the gate electrode causes an OFET response. According to one example, external circuitry 16 is configured to apply a constant voltage across the source and drain electrodes 4, and to the gate electrode 10, and to detect changes in the current between the source and drain electrodes 4, which changes in current can be correlated to changes in concentrations of target species at the gate electrode 10.

The channel 12 may, for example, be created by clamping or bonding a capping structure (made of e.g. polydimethylsiloxane (PDMS)) to the support substrate (e.g. glass) supporting the source and drain conductors and the organic semiconductor layer providing the semiconductor channel between the source and drain conductors. For example, the capping structure may be clamped or bonded (e.g. plasma bonding) to the support substrate in regions where a semiconductor patterning process has removed portions of an organic semiconductor film initially formed over the whole area of the support substrate. The channel ensures good delivery and removal of an analyte, based on its chemical kinetics. With reference to FIG. 10, a semiconductor parameter analyser (SPA) was combined with a syringe pump to provide a system capable of pumping liquids from a choice of five different reservoirs into the flow cell while measuring the source-drain current at specific time intervals. In this example, the capping structure (e.g. PDMS) supports a Ag/AgCl gate electrode, which is maintained at a voltage below the hydrolysis limit (−1.23 V), to avoid triggering electrolysis. This structure facilitates the production of flow cells with very small volumetric sizes, such as about 3 microlitres or smaller.

FIGS. 11a and 11b together show a comparison between IDTBT water-gated transistors without additive (FIG. 11a) and with F2-TCNQ additive (FIG. 11b) for a time duration of about 7 hours. A static volume of deionised water provides the gate dielectric. The pristine device (without additive) is observed to exhibit an on current ($I_{on}$) that continuously decreases for the first 300 minutes and then rises, which rise is attributed to electrochemical doping of the semiconductor by ions produced by electrochemical reactions taking place at the gate electrode. The device with the F2-TCNQ additive remains immune to water degradation and electrochemical doping for 500 minutes. The differences in $I_{on}$ values between the device without additive (FIG. 11a) and the device with F2-TCNQ additive (FIG. 11b) are attributed to slight doping effects induced by F2-TCNQ.

In the example described above, the gate voltage is maintained at a level that avoids triggering electrolysis, but the additive is also able to mitigate degradation (which would otherwise be reflected in a change of the on-current) that can be caused by the by-products of electrochemical reactions that can result from biasing the liquid as part of the operation of the kind of liquid-gated transistors described above. FIG. 12 shows the variation in the source-drain current for the flow cell described above (using IDTBT with TCNQ additive for the semiconductor channel) when the fluid pumped through the flow cell is switched from deionised water to an example of an analyte. Deionised water was first pumped through the cell for about 450 minutes, and the source-drain current $I_{on}$ is again observed to be relatively stable. After about 450 minutes, the fluid pumped through the flow cell is switched from deionised water to a phosphate buffer solution (pH=3.2, 50 mM). The source-drain current is observed to increase by around one order of magnitude before returning to the baseline level when the fluid pumped through the flow cell is switched back again to deionised water to wash the buffer solution out of the flow cell. It can be seen that when the phosphate buffer solution is flowing through the cell the current of the transistor remains constant with fluctuations of less than 30%, that could be further reduced by eliminating the sudden current spikes (also seen when DI water is used). These are caused by the pump cycles, when new fluid is drawn in the pump. These measurements show that the device is stable enough to function as a sensor in an aqueous medium. If a target analyte was added to the buffer solution the binding of the target analyte to the gate electrode 10 could be detected as a change in current with respect to the stable baseline current level.

FIG. 9 schematically illustrates another example of a sensor system according to an embodiment of the present invention. In this example, the OFET has a bottom-gate bottom-contact (BGBC) configuration, and the sensor defines a channel/space 12 to bring aqueous solution to be analysed into contact with the stable organic semiconductor at the top of the OFET. The binding of any target species in the aqueous solution to the stable organic semiconductor causes an OFET response. According to one example, external circuitry 16 is configured to apply a constant voltage across the source and drain electrodes 4, and to the gate electrode 10, and to detect changes in the current between the source and drain electrodes 4, which changes in current can be correlated to changes in concentrations of target species at the stable organic semiconductor 6.

The examples of sensor systems of FIGS. 8 and 9 are both characterised by full exposure of the stable organic semiconductor to the aqueous solution to be analysed, and thereby fully exploit the stability of the organic semiconductor, but the organic semiconductors exhibiting the above-described excellent stability in aqueous solutions can also be used in other configurations of sensor systems in which the organic semiconductor has some, but less exposure to the aqueous solution to be analysed.

Mixtures of IDTBT and F4-TCNQ or TCNQ are used above as examples of organic semiconductors to illustrate embodiments of the present invention, but there are other examples of high-mobility organic semiconductors for which the inventors for the present application have also observed stable OFET performance both in air and in nitrogen. Other examples include mixtures of IDTBT or other high-performance semiconductor polymers (e.g. exhibiting an on-off ratio of 10,000 or more in conventional thin film transistor architectures with polymer gate dielectrics) such as DPP-DTT (shown below), and one or more organic compounds comprising an electronegative group ranked higher than 2 on the Pauling scale, particularly one or more organic compounds comprising nitrile groups and/or fluorine groups, and more particularly other aromatic quinone-derivative compounds comprising =C(CN)2 groups, such as F4-TCNQ, TCNQ, F2-TCNQ (shown below) and F6-TCNNQ (shown below), and alicyclic organic compounds comprising cross-conjugated exocyclic double bonds and =C(CN)2 groups, such as CN6-CP (shown below), or suitable derivatives thereof, such as derivatives including side chains substitutions that improve the intersolubility of the organic compound and the semiconductor polymer.

DPP-DTT (diketopyrrolo-pyrrole-dithiophene-thienothiophene)

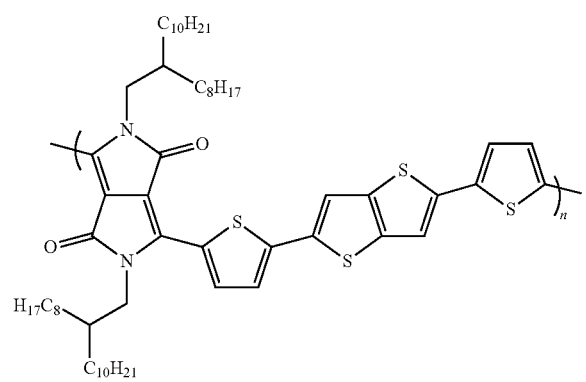

F6-TCNNQ
(hexafluorotetracyano-naphthoquinodimethane)

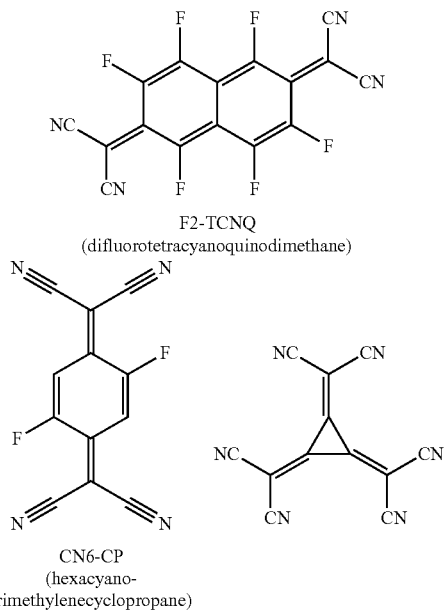

F2-TCNQ
(difluorotetracyanoquinodimethane)

CN6-CP
(hexacyano-trimethylenecyclopropane)

Without wishing to be bound by theory, the inventors for the present application consider that the link between stability in both air and nitrogen and stability in aqueous media arises from the action of the F4-TCNQ etc. (which has a similar molecular size as a water molecule and has an affinity to form a non-covalent bond with the organic semiconductor) occupying the nanometer-sized cavities (in the case of semiconductor polymers) or grain boundaries (in the case of polycrystalline small molecule semiconductors) that water (either present in the semiconductor polymer because of the production process, and/or in the fluid environment to which the semiconductor polymer is exposed) would otherwise occupy. When incorporated, the molecular additive (F4-TCNQ etc.) is able to perturb the electrochemical reaction between water and the radical cations on the organic semiconductor, such that this reaction is no longer able to proceed efficiently.

The molecular additive preferably has the following properties:
(i) The molecular size of the additive is comparable to that of a water molecule, such that the additive can become incorporated into the small, nanometer-sized pores. The molecular additive should therefore be smaller than preferably 5 nm, more preferably smaller than 2 nm, most preferably smaller than 1 nm. Molecular size is defined here as the distance between the two atoms that are furthest apart within the molecule.
(ii) For a device operating in p-type mode the electron affinity of the molecular additive is smaller than the ionisation potential of the organic semiconductor, such that the incorporation of the additive does not lead to molecular p-type doping of the organic semiconductor and an undesirable increase in OFF current. The electron affinity of the molecular additive is therefore preferably smaller by 0.1 eV than the ionisation potential of the organic semiconductor, more preferably smaller than 0.3 eV, most preferably smaller than 0.5 eV. Analogously, for a device operating in n-type mode, the ionisation potential of the molecular additive should be higher than the electron affinity of the organic semiconductor, in order to prevent undesirable n-type doping of the organic semiconductor by the molecular additive.
(iii) The ionisation potential of the molecular additive should be larger than that of the organic semiconductor, such that holes induced on the organic semiconductor cannot be injected onto the molecular additive. The ionisation potential of the molecular additive should be larger than that of the organic semiconductor preferably by 0.3 eV, more preferably 0.5 eV and most preferably by 1 eV. An analogous criterion applies to the electron affinity of the molecular additive with respect to the electron affinity of the organic semiconductor in the case of devices operating in n-type mode.
(iv) The weight ratio between the molecular additive and the organic semiconductor in the films is preferably on the order of at least 1%, such that all nanoscale pores/voids can be filled with the additive without the additive degrading the transport properties of the organic semiconductor by interrupting the charge transport pathways in the organic semiconductor. In the case of a solid additive this requires the additive to have a solid solubility of at least 1% in the organic semiconductor.
(v) The molecular additive has preferably a non-covalent, favourable binding interaction with the organic semiconductor that is comparable in strength or larger than that between the organic semiconductor and water such that the molecular additive is easily incorporated into the nanoscale pores and is able to compete with water for binding sites on the organic semiconductor. This will generally mean that the molecular additive has a higher solubility in the organic semiconductor than water has in the organic semiconductor.

(vi) Preferably, the molecular additive is also able to undergo a non-covalent hydrogen bonding interaction with water, such that it can perturb the molecular geometry and/or the electron density distribution around the water molecules within the nanoscale pores and in this way suppress the electrochemical oxidation of water in the presence of radical cations on the organic semiconductor. This will generally mean that the molecular additive will exhibit a finite solubility in water, preferably higher than 0.1%.

(vii) The molecular additive should not degrade the TFT performance by either shifting the threshold voltage by more than 2 V, more preferably not by more than less than 1V, and most preferably not by more than 0.3V. Also the molecular additive should not reduce the organic semi-conductor mobility by more than 20%, more preferably not by more than 5% and most preferably not by more than 2%. Finally the molecular additive should not increase the transistor off current by more than 10×, more preferably by not more than 5× and most preferably by not more than 1.2×.

In addition to any modifications explicitly mentioned above, it will be evident to a person skilled in the art that various other modifications of the described embodiments may be made within the scope of the invention.

The invention claimed is:

1. A sensor device for detecting a target species in an aqueous media and/or measuring the concentration of a target species in an aqueous media, the sensor device comprising:
    (a) an active semiconductor comprising an organic semiconductor material that exhibit substantially the same transfer curve for a period of at least 24 hours when first exposed to air; and
    (b) a structure for directing an aqueous media into contact with the sensor device,
    wherein the organic semiconductor material comprises a mixture of a polymer semiconductor and a small molecule organic compound comprising at least one electronegative group having a ranking of higher than 2 on the Pauling scale.

2. The sensor device according to claim 1, wherein the organic semiconductor material exhibits no more than about a 10% change in $I_{on}$ for a period of at least 24 hours when first exposed to air.

3. The sensor device according to claim 1, wherein the organic semiconductor material exhibits an on-off ratio of at least 10,000.

4. The sensor device according to claim 1, wherein the small molecule organic compound comprises at least one nitrile group and/or at least one fluorine group.

5. The sensor device according to claim 4, wherein the small molecule organic compound comprises one or more aromatic quinone-derivative compounds comprising one or more =C(CN)$_2$ groups and/or one or more alicyclic organic compounds comprising cross-conjugated exocyclic C=C double bonds and one or more =C(CN)$_2$ groups.

6. The sensor device according to claim 5, wherein the small molecule organic compound comprises one or more of: 2,3,5,6-Tetrafluoro-7,7,8,8-tetracyanoquinodimethane, 7,7,8,8-Tetracyanoquinodimethane, hexafluorotetracyanonaphthoquinodimethane, difluorotetracyanoquinodimethane and hexacyano-trimethylenecyclopropane or derivatives thereof.

7. The sensor device according to claim 1, wherein the active semiconductor forms part of a field effect transistor, and the structure (b) directs an aqueous media into a region where the aqueous media forms a gate dielectric of the field effect transistor in contact with both the active semiconductor and a gate electrode of the field effect transistor.

8. The sensor device according to claim 1, wherein the active semiconductor forms part of a bottom-gate field effect transistor, and the structure (b) directs an aqueous media into contact with the active semiconductor.

9. The sensor device according to claim 1, further comprising electrical circuitry configured to determine detection of the target species or determine a concentration of the target species based on an electrical response of the sensor device.

10. A method, comprising:
    using for the active semiconductor of a sensor whose operation involves contacting the sensor with an aqueous media, an organic semiconductor material that exhibits substantially the same transfer curve for a period of at least 24 hours when first exposed to air,
    wherein the organic semiconductor material comprises a mixture comprising an organic semiconductor and an organic compound including one or more electronegative groups having a ranking on the Pauling scale of higher than 2.

11. The method according to claim 10, comprising: detecting a target species in aqueous media and/or measuring the concentration of a target species in aqueous media, using said sensor.

12. The method according to claim 10, comprising: detecting a target species in aqueous media and/or measuring the concentration of a target species in aqueous media, using the sensor, wherein the organic semiconductor material comprises an organic semiconductor that exhibits less than 30% variation in current through the organic semiconductor material for at least the final 400 minutes of a 500 minute period of operation in a transistor comprising a gate dielectric consisting of a static volume of deionised water, a gate electrode biased at an on voltage that does not trigger electrolysis, and source-drain electrodes at a potential difference of 1V.

13. A method, comprising:
    detecting a target species and/or measuring concentration of a target species in an aqueous media using a sensor device,
    wherein the aqueous media comprises ionic species in a higher concentration than the target species, and
    wherein the sensor device comprises an active semiconductor comprising an organic semiconductor material that exhibits substantially the same transfer curve for a period of at least 24 hours when first exposed to air.

14. The method according to claim 13, wherein the organic semiconductor material comprises a mixture comprising an organic semiconductor and an organic compound including one or more electronegative groups having a ranking on the Pauling scale of higher than 2.

15. The method according to claim 13, comprising contacting the active semiconductor with the aqueous media.

* * * * *